United States Patent
Kondo et al.

(10) Patent No.: US 12,140,304 B2
(45) Date of Patent: Nov. 12, 2024

(54) PHOSPHOR ELEMENT WITH HEAT DISSIPATING SUBSTRATE THAT HAS THERMALLY CONDUCTIVE METAL PLATING FILM

(71) Applicant: NGK INSULATORS, LTD., Nagoya (JP)

(72) Inventors: Jungo Kondo, Miyoshi (JP); Keiichiro Asai, Nagoya (JP); Naotake Okada, Anjo (JP)

(73) Assignee: NGK INSULATORS, LTD., Nagoya (JP)

( * ) Notice: Subject to any disclaimer, the term of this patent is extended or adjusted under 35 U.S.C. 154(b) by 843 days.

(21) Appl. No.: 17/186,578

(22) Filed: Feb. 26, 2021

(65) Prior Publication Data

US 2021/0184425 A1 Jun. 17, 2021

Related U.S. Application Data

(63) Continuation of application No. PCT/JP2018/031687, filed on Aug. 28, 2018.

(51) Int. Cl.
*F21V 9/30* (2018.01)
*F21V 29/502* (2015.01)
(Continued)

(52) U.S. Cl.
CPC .............. *F21V 9/30* (2018.02); *F21V 29/502* (2015.01); *F21V 29/89* (2015.01); *F21Y 2115/30* (2016.08); *H01S 5/0087* (2021.01)

(58) Field of Classification Search
CPC ......... H01S 5/0087; F21V 29/502; F21V 9/30
See application file for complete search history.

(56) References Cited

U.S. PATENT DOCUMENTS

2010/0148203 A1 6/2010 Hashimoto et al.
2012/0106126 A1* 5/2012 Nojima ................. G03B 33/08
362/296.01
(Continued)

FOREIGN PATENT DOCUMENTS

JP 2008186850 A 8/2008
JP 2008305811 A 12/2008
(Continued)

OTHER PUBLICATIONS

International Search Report with English Translation issued in corresponding International Application No. PCT/JP2018/031687 date of mailing Nov. 27, 2018 (5 pages).
(Continued)

*Primary Examiner* — Abdulmajeed Aziz
*Assistant Examiner* — Steven Y Horikoshi
(74) *Attorney, Agent, or Firm* — FLYNN THIEL, P.C.

(57) ABSTRACT

A phosphor element includes a phosphor part including an incident face of the excitation light, opposing face opposing the incident face, and side face, the phosphor part converting at least a part of the excitation light incident onto the incident face to fluorescence and emitting the fluorescence from the opposing face or incident face, and a heat dissipating substrate provided on the side face of the phosphor part. The heat dissipating substrate is composed of a metal plating film composed of a metal having a thermal conductivity of 200 W/mK or higher.

8 Claims, 31 Drawing Sheets

(51) Int. Cl.
*F21V 29/89* (2015.01)
*F21Y 115/30* (2016.01)
*H01S 5/00* (2006.01)

(56) References Cited

U.S. PATENT DOCUMENTS

| | | |
|---|---|---|
| 2013/0100635 A1 | 4/2013 | Xu et al. |
| 2015/0077972 A1* | 3/2015 | Sugiyama ........... H01S 5/02257 362/553 |
| 2015/0292687 A1* | 10/2015 | Sugiyama ........... H01S 5/02212 362/259 |
| 2015/0316233 A1 | 11/2015 | Kawamata et al. |
| 2018/0058642 A1* | 3/2018 | Shibata .................... F21K 9/64 |
| 2019/0195440 A1* | 6/2019 | Sato ..................... H01S 5/0609 |
| 2019/0338937 A1* | 11/2019 | Inoue ........................ F21V 7/28 |
| 2020/0271282 A1 | 8/2020 | Aketa et al. |
| 2021/0098657 A1* | 4/2021 | Ito ......................... H01L 33/502 |
| 2021/0339314 A1* | 11/2021 | Riesselmann ........... B22F 5/106 |
| 2022/0021257 A1* | 1/2022 | Aizawa ................... H01B 7/00 |

FOREIGN PATENT DOCUMENTS

| | | |
|---|---|---|
| JP | 2010147183 A | 7/2010 |
| JP | 5679435 B2 | 9/2012 |
| JP | 201785038 A | 5/2017 |
| WO | 2012006128 A2 | 1/2012 |
| WO | 2013175706 A1 | 11/2013 |
| WO | 2014021027 A1 | 2/2014 |
| WO | 2017110031 A1 | 6/2017 |

OTHER PUBLICATIONS

Written Opinion of International Searching Authority issued in corresponding International Application No. PCT/JP2018/031687 dated Nov. 27, 2018 (5 pages).
Toshimichi Fukuoka et al. Evaluation of Thermal Contact Resistance at the Interface Composed of Dissimilar Materials, Journal Article, vol. 76(763), pp. 344-350, issued Mar. 25, 2010 (8 pages).
English Translation of the International Preliminary Report on Patentability, issued in corresponding International Application No. PCT/JP2018/031687 Date of Mailing Mar. 11, 2021 (9 pages).

* cited by examiner

Results of calculation of heat conduction efficiency

PHOSPHOR ELEMENT WITH HEAT DISSIPATING SUBSTRATE THAT HAS THERMALLY CONDUCTIVE METAL PLATING FILM

CROSS-REFERENCE TO RELATED APPLICATIONS

This is a continuation of PCT/JP2018/031687, filed Aug. 28, 2018, the entire contents of which are hereby incorporated by reference.

TECHNICAL FIELD

The present invention relates to a phosphor element and illumination device emitting a fluorescence.

BACKGROUND ARTS

Recently, intensive study has been undertaken in headlights for a vehicle employing a laser light source, and one thereof is a white light source constructed by combining blue laser or ultraviolet laser and a phosphor. The optical density of excitation light can be increased by condensing laser light, and, moreover, a light intensity of the excitation light can also be increased by condensing multiple beams of laser light so as to overlap on the phosphor. As a result, light flux and brightness can simultaneously be increased without changing a light emission area. Therefore, a white light source that combines semiconductor laser and a phosphor with each other is attracting attention as a light source that replaces the LED. For example, as phosphor glass used for the vehicle headlight, phosphor glass "Lumiphous™" from Nippon Electric Glass and YAG monocrystal fluorescent bodies from National Institute for Materials Science, Tamura Corporation, and Koha Co., Ltd. are proposed.

According to a phosphor element described in patent document 1 (U.S. Pat. No. 5,679,435B), the width of the phosphor is made larger from an incident face to an emitting face. It is described that the inclination angle of the side face of the phosphor is made 15° or larger and 35° or lower. Then, the phosphor is contained in a resin case, and a metal film is formed so that the inner surface of the case is functioned as a reflector part. The phosphor is fixed on the bottom face of the case with a sealing resin, and the side face of the phosphor is covered with air.

According to a phosphor element described in patent document 2 (JP 2017-085038A), the width of the phosphor is increased from an incident face to an emitting face, the phosphor is contained in a through hole of a heat dissipation member, and a side face of the through hole is bonded with the surface of the through hole with glass paste.

According to patent document 3 (WO 2013-175706 A1), it is described a phosphor element in which a phosphor is contained in a through hole of a heat dissipation member and the phosphor is fixed in the through hole (FIGS. 15 to 18). It is disclosed that the heat dissipation member is a metal plate composed of a metal having a high thermal conductivity such as copper and aluminum, and that a through hole is formed in the metal plate and the phosphor is fixed in the through hole by fitting structure or counter boring structure.

Non-Patent Documents

Non-Patent Document 1

"Evaluation of Thermal Contact Resistance at the Interface Composed of Dissimilar Materials", Toshimichi, FUKUOKA, et. al., Transactions of the Japan Society of Mechanical Engineers. A, 76(763), Pages 344 to 350, March, 2010

Patent Documents (Patent document 1) Japanese patent No. 5679435B
(Patent document 2) Japanese patent No. 2017-085038A
(Patent document 3) WO 2013-175706 A1

SUMMARY OF THE INVENTION

According to the phosphor elements for illumination of the prior arts, it is tried to dissipate heat, as possible, generated within a phosphor plate, by bonding and integrating a heat dissipating substrate composed of a highly heat dissipating material with the phosphor plate.

However, as the inventors have conducted the research, the following problems are found. That is, it is necessary to improve the intensity of the excitation light, for improving the intensity of the fluorescence. However, as the intensity of the fluorescence is raised, the intensity of the fluorescence may be lowered as the time passed by during use, resulting in color unevenness. It is thereby necessary to maintain the fluorescence intensity of the emitted light high during continued use and to suppress the color unevenness.

An object of the present invention is, in irradiating an excitation light onto a phosphor part to generate a fluorescence, to improve the intensity of the fluorescence and to suppress color unevenness of irradiated white light upon continued use.

The present invention provides a phosphor element comprising:
   a phosphor part including an incident face of an excitation light, an opposing face opposing said incident face and a side face, said phosphor part converting at least a part of said excitation light incident onto said incident face to a fluorescence and emitting said fluorescence from said opposing face or said incident face, and
   a heat dissipating substrate provided over said side face of said phosphor part, said heat dissipating substrate comprises a metal plating film comprising a metal having a thermal conductivity of 200 W/mK or higher.

The present invention further provides an illumination device having a light source oscillating a laser light and the phosphor element.

According to the inventive phosphor element, when excitation light is made incident onto the phosphor part to generate fluorescence, it is possible to maintain the intensity of the fluorescence in emitted light during continued use and to suppress color unevenness.

This point will be further described below. According to the prior phosphor element described in patent document 3, the through hole is provided in the heat dissipation member and the phosphor element is fitted into the through hole, so as to escape the heat, generated during the light emission of the phosphor element, to the heat dissipation member. However, actually, the intensity of the fluorescence emitted from the phosphor may be lowered and color unevenness may occur during continued use.

As the inventors have researched the cause, the followings are found. That is, the hole formation or counter-boring in the heat dissipation member can be performed by drilling, laser processing or wire discharge processing. In the case of the drilling or laser processing, as the surface inside of the hole after the processing is a roughened surface, the finishing is performed by removing burr in the holed member by a grinding brush such as a flexible horne or the like and by raising the grain size of the grinding stones of the brush, resulting in reduction of the surface roughness Ra. Further, the wire discharge processing means the process that a pulse high voltage is applied between a wire and work to generate arc discharge to melt the work and to perform the cutting-out process. It is possible to perform the process repeatedly for lowering the surface roughness Ra in the hole. However, in the case that the through hole is provided in the metal heat dissipating substrate, the surface roughness Ra facing the through hole is about 1.5 to 10 μm.

Further, the material of the phosphor may preferably be a ceramics or single crystal, on the viewpoint of the direct bonding for the heat discharge. In the case of the ceramics, the phosphor can be shaped by mixing an inorganic binder and then sintered, so that it is possible to produce the phosphor having an optional shape. Further, in the case of the single crystal, it is possible to produce the phosphor by the crystal growth by Czochralski method or the like. Thereafter, the crystal is shaped into a wafer by slicing or beveling process and the wafer is then subjected to lapping or CMP polishing, and finally cut by dicing into small pieces. However, as a ceramics or single crystal has a high hardness, the surface roughness Ra of the side face of the phosphor element after the cutting is actually about 10 μm.

Thus, for example as shown in FIG. 1 (b), in the case that the phosphor 5 is fit into the through hole 6a of the heat dissipating substrate 6, it was considered that it is possible to contact and mechanically fix the phosphor 5 and heat dissipating substrate 6 and thereby to perform the heat dissipation without a problem. However, in actuality, in the case that the phosphor 5 and heat dissipating substrate 6 are contacted with each other, it is considered that minute protrusions at the surface 5a of the phosphor 5 and minute protrusions 6a at the surface of the heat dissipating substrate 6 are contacted with each other by point contact as arrow E at the interface between them and that micro spaces are generated along the interface of them. Due to such micro spaces, the flow of the heat at the interface of them (heat dissipation) is largely dependent on the surface roughnesses and fine morphology of them. The inventors speculated that such fine structure at the interface results in the reduction of the intensity of the fluorescence and color unevenness during continued use, and have researched further.

As a reference, non-patent document 1 indicated that the heat dissipation at the interface between dissimilar materials is considerably influenced by the surfaced roughnesses by simulating the contact heat transfer coefficient influenced by the surface roughnesses at the interface of the dissimilar materials. According to this, as the surface roughnesses at the interface of the dissimilar materials are larger, the contact heat transfer coefficient is linearly lowered, and the contact heat resistance is increased to suppress the flow of the heat.

In this case, as the surface roughness of the one is increased at a some degree, the contact heat transfer coefficient is not larger even in the case that the surface roughness of the other is made smaller.

The inventors have calculated it by applying the formula (4) described in non-patent document (4) and assigning the phosphor and copper as the dissimilar materials. It was provided that the parameters required for the calculation were set as shown in table 1 and that the surface roughness Rat of the phosphor element was set at 1 μm, 3 μm, 6 μm or 10 μm, the calculation results of the contact heat transfer coefficient hc with respect to the surface roughness Ra2 of copper were shown in FIG. 31.

TABLE 1

| Parameters | 1: phosphor | 2: copper |
|---|---|---|
| Thermal Conductivity (W/mK) | 10 | 400 |
| Vickers Hardness (HV) | 2000 | 100 |
| c1 | 0.01 | 0.01 |
| c2 | 0.025 | 0.025 |
| c3 | 0.15 | 0.15 |
| m | 1 | 1 |
| n | 0.8 | 0.8 |
| pressure at interface P (MPa) | 10 | 10 |

Note:
According to fitting structure, it is necessary to make clearance large, and the plane pressure cannot be made large.

Heat conduction efficiency ho:

$$h_c = 10^5 \left[ c_1 \lambda_1 \frac{\left(\frac{p}{Hv_1}\right)^{2/3}}{Ra_t^m} + c_2 \lambda_2 \frac{\left(\frac{p}{Hv_2}\right)^{2/3}}{Ra_t^m} + \frac{c_3}{Ra_t^n} \right]$$

Non-patent document 1 Formula (4)

Rat: Ra1 (1: surface roughness of phosphor) + Ra2 (2: surface roughness of copper)

As a result, in the case that the surface roughness Rat of the phosphor is made 10 μm, the contact heat transfer coefficient is 9500 W/mK$^2$, 12000 W/mK$^2$ and 20000 W/mK$^2$, respectively, provided that the surface roughness Ra2 of copper is made 18 μm, 10 μm and 1.5μ m, respectively. In this case, even in the case that the surface roughness of copper could have made 1 μm or lower, the heat transfer coefficient could be made about 240000 W/mK$^2$ at the best. It means the followings. As the contact through the fitting is performed by point contact, even in the case that the surface roughness of the one material is made as low as possible, it is suggested that the contact heat transfer coefficient cannot be improved due to the rate-determination by the other material having a larger surface roughness. It is in conformity with the reduction of the intensity of the fluorescence and color unevenness of the phosphor element during continued use.

Based on such results, the inventors have researched the structure capable of improving the state at the interface between the heat dissipating substrate and phosphor part. As a result, by forming the heat dissipating substrate with metal plating, as shown in FIG. 1(c), even in the case that the surface roughness of the side face 2c of the phosphor 2 is large. The metal is incorporated into unevenness on the surface of the side face 2c so as to realize the structure of contacting in plane-contact mode microscopically. It is thereby found that the contact heat transfer coefficient can be considerably improved. As a result, it is found that the heat generated in the phosphor can be efficiently discharged through the heat dissipating substrate and the reduction of the conversion efficiency of the fluorescence and the color unevenness due to temperature quenching of the phosphor can be suppressed during continued use. The invention is thus made.

EMBODIMENTS FOR CARRYING OUT THE INVENTION

Figure 1A:
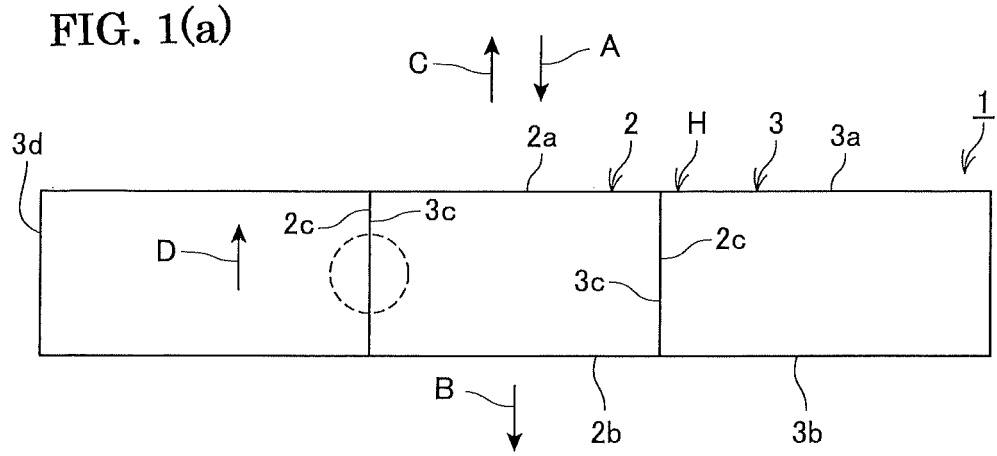
FIG. 1(a) is a cross sectional view showing a phosphor element according to an embodiment of the present invention, FIG. 1(b) schematically shows microstructure of a prior phosphor element, and FIG. 1(c) schematically shows microstructure according to a phosphor element of the present invention.
Figure 1B:
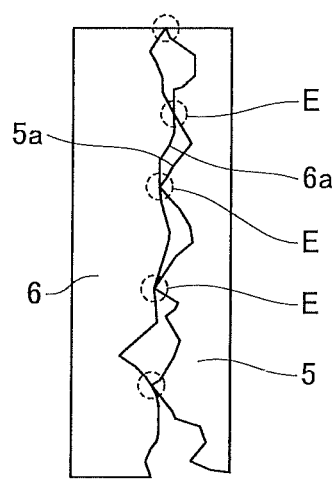
Figure 1C:
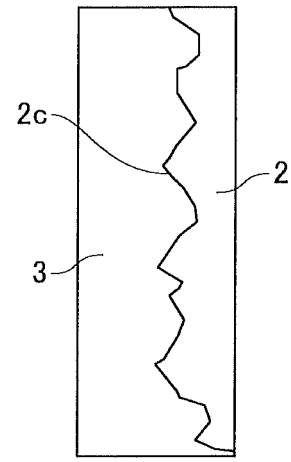

The phosphor element of the present invention includes a phosphor part having an incident face of an excitation light, an opposing face opposing said incident face, and a side face, and the phosphor part converting at least a part of the excitation light incident onto the phosphor plate to fluorescence and emitting the fluorescence from the opposing face or incident face.

Here, in the case that the whole of the excitation light is converted into the fluorescence, only the fluorescence is emitted from the opposing face or incident face. Alternatively, a part of the excitation light is converted to the fluorescence, so that the excitation light and fluorescence can be emitted from the opposing face or incident face.

Although the phosphor constituting the phosphor part is not limited as far as it can convert the excitation light into the fluorescence, it includes a phosphor glass, phosphor single crystal or phosphor polycrystal.

Further, a scattering material may be added or pores may be formed in the phosphor for scattering the excitation light and fluorescence. In this case, the light incident into the phosphor is scattered in the phosphor so that the emitted lights (excitation light and fluorescence) are scattered and the scattering angle is made larger.

The scattering angle can be measured by a scattering measuring system "Mini-Diff" supplied by Cybernet Systems Co., Ltd., for example. The scattering angle is defined as a total width angle at which it takes a value of 1/e2 of the peak value in transmittance spectrum of the emitted light.

At the time, the scattering angle may preferably be 5° or larger and more preferably be 10° or larger. Then, although the upper limit of the scattering angle of the phosphor forming the phosphor part is not particularly defined, it may be not larger than the numerical aperture (NA) of the emitted light and may be 80° or smaller on a practical viewpoint.

The phosphor glass means a base glass into which ions of a rare earth element is dispersed.

As the glass serving as the base, oxide glasses containing silica, boron oxide, calcium oxide, lanthanum oxide, barium oxide, zinc oxide, phosphorus oxide, aluminum fluoride, magnesium fluoride, calcium fluoride, strontium fluoride, or barium chloride may be exemplified.

Though the rare earth ions diffused in the phosphor glass are preferably Tb, Eu, Ce, and Nd, the rare earth ions may be La, Pr, Sc, Sm, Er, Tm, Dy, Gd, or Lu.

As the phosphor monocrystal, $Y_3Al_5O_{12}$, $Ba_5Si_{11}Al_7N_{25}$, $Tb_3Al_5O_{12}$, and YAG (yttrium·aluminum·garnet) are preferable. Apart of the Y (yttrium) of YAG may be replaced with Lu. Further, a dopant doped into the phosphor single crystal may preferably be a rare earth ion and particularly preferably be Tb, Eu, Ce, and Nd, and the rare earth ions may be La, Pr, Sc, Sm, Er, Tm, Dy, Gd, or Lu.

Further, as the phosphor polycrystal, TAG (terbium·aluminum·garnet) series, sialon series, nitride series, BOS (barium·orthosilicate) series, and YAG (yttrium·aluminum·garnet) are exemplified. A part of the Y (yttrium) of YAG may be replaced with Lu.

Further, a dopant doped into the phosphor polycrystal may preferably be a rare earth ion and particularly preferably be Tb, Eu, Ce, and Nd, and the rare earth ions may be La, Pr, Sc, Sm, Er, Tm, Dy, Gd, or Lu.

The phosphor device of the present invention may be a non-grating type phosphor device which does not include a grating within the phosphor, or a grating device, in which the grating is provided in the phosphor part.

The phosphor part includes at least an incident face of an excitation light, an opposing face and a side face. The side face means a face extending between the incident face and opposing face. Here, the shape of the phosphor part is not particularly limited. For example, the shape of the incident face or opposing face of the phosphor part may be a circle, ellipse, or a polygon such as a triangle, rectangle or hexagon.

Further, after the excitation light is made incident onto the incident face, at least a part of the excitation light is converted to the fluorescence within the phosphor part. Here, the fluorescence and optionally the excitation light can be emitted from the opposing face. Alternatively, by forming a reflective film on the opposing face, the fluorescence and excitation light can be reflected so that the excitation light and fluorescence can be emitted from the incident face.

A partial transmission film may be further provided on the incident face of the phosphor plate. The partial transmission film is a film reflecting a part of the excitation light and transmitting the remainder. Specifically, a reflectivity of the partial transmission film with respect to the excitation light is 9 percent or higher and is preferably 50 percent or lower. A material of the partial transmission film includes a metal film or a dielectric multi-layered film for the reflection film described later.

According to the present invention, a heat dissipating substrate is provided on the side face of the phosphor part, and the heat dissipating substrate is composed of a metal plating film composed of a metal having a thermal conductivity of 200 W/mK or higher. Here, the side face of the phosphor part means a face extending between the incident face and opposing face.

The kind of the metal plating film may be an electroplating film or an electroless plating film. Further, the metal plating film is composed of a metal having a thermal conductivity (25° C.) of 200 W/mK or higher. Although the upper limit of the thermal conductivity of the metal is not particularly limited, it may be made 350 W/mK or lower, on the viewpoint of practical availability.

The kind of the metal forming the metal plating film of the phosphor part may particularly preferably be gold, silver, copper, aluminum or the alloys containing the metal.

According to a preferred embodiment, an angle of the direction of growth of the metal plating film from the main face of the opposing face side of the heat dissipating substrate and of the incident face (or an angle of the direction of growth of the metal plating film from the main face of the incident face side of the heat dissipating substrate and of the incident face) is 60 to 120°, more preferably 70 to 110° and most preferably 80 to 100°. The state of filling irregularity at the bonding interface between the metal plating film and phosphor part can be further improved the quality of the luminescence in continuous use can be made excellent.

According to a preferred embodiment, it may be provided an incident face-side supporting substrate on the main face on the side of the incident face of the heat dissipating substrate, so that the heat dissipation effects through the heat dissipating substrate can be further improved. Further, according to another embodiment, an opposing face-side supporting substrate may be provided on the main face on the opposing face side of the heat dissipating substrate, so that the heat dissipation effects through the heat dissipating substrate can be further improved.

Here, the material of each of the supporting substrates may preferably be a material having a thermal conductivity (25° C.) of 200 W/mK or higher and particularly preferably of 300 W/mK or higher. Although the upper limit of the thermal conductivity of the material is not particularly limited, it may be made 500 W/mK or lower, on the viewpoint of practical availability.

Here, the material of each of the supporting substrates may preferably be transparent or translucent. However, a window may be provided in the incident face-side supporting substrate for irradiating the excitation light onto the incident face, and in this case, the material of the incident face-side supporting substrate is not necessarily transparent or translucent. On the other hand, in the case that the excitation light and fluorescence are emitted from the opposing face, a window may be provided in the opposing face-side supporting substrate for emitting the light from the opposing face, and in this case, the material of the opposing face-side supporting substrate is not necessarily transparent or translucent.

In the case that the material of each of the supporting substrates is transparent or translucent, the material of the supporting substrate may preferably be alumina, aluminum nitride, silicon carbide, quartz or a glass.

In the case that the material of each of the supporting substrates is not transparent or translucent, the material of the supporting substrate may preferably be alumina, aluminum nitride, silicon carbide, quartz, a glass, copper, silver, gold, aluminum or the alloy material containing the metal. The materials of the respective supporting substrates may be the same or different with each other.

The phosphor part and metal plating film may be directly contacted with each other. However, according to a preferred embodiment, a low refractive index layer is provided between the phosphor part and metal plating film. Further, according to a preferred embodiment, a reflection film is provided between the phosphor part and metal plating film.

In the case that such structure is applied, the state of filling of the metal plating film into the irregularity is improved to obtain the effects of improving the heat dissipation.

As the material of the low refractive index layer, aluminum oxide, magnesium oxide, aluminum nitride, tantalum oxide, silicon oxide, silicon nitride, aluminum nitride and silicon carbide are exemplified. Further, the refractive index of the low refractive index layer may preferably be that of the phosphor, and preferably 1.7 or lower and more preferably 1.6 or lower in the case of the YAG phosphor. Although the lower limit of the refractive index of the low refractive index layer is not particularly defined and 1 or higher, it may practically be 1.4 or higher.

In the case that the low refractive index layer is present between the phosphor part and reflection film, it is preferred that the low refractive index layer is composed of a material whose refractive index is lower than that of the phosphor. It is thereby possible to utilize the total reflection due to the difference of refractive indices of the phosphor and low refractive index layer, to reduce optical component reflected at the reflection film and to suppress the absorption of light by reflection at the reflection film. Further, aluminum oxide and magnesium oxide are most preferred on the viewpoint of heat dissipation.

The thickness of the low refractive index layer may preferably be 1 µm or smaller, so that it is possible to reduce the influences on the heat dissipation. Further, the thickness of the low refractive index layer may preferably be 0.05 µm or larger, on the viewpoint of the bonding strength.

The material of the reflective film is not particularly limited, as far as it is possible to reflect the excitation light and fluorescence passing through the phosphor layer. It is not necessary that the excitation light is reflected by the reflection film by total reflection, and that a part or whole of the excitation light may be transmitted through the reflection film.

According to a preferred embodiment, the reflection film is a metal film or dielectric multi-layered film.

In the case that the reflection film is composed of the metal film, the reflection can be performed in a wide wavelength range, the dependency on the incident angle can be lowered, and temperature-resistance and weather-resistance are excellent. On the other hand, in the case that the reflection film is composed of the dielectric multi-layered film, as the absorption is avoided, it is possible to convert the incident light to the reflection light by 100 percent without loss, and as the reflection film can be formed with oxide films, it is possible to improve the adhesion with the bonding layer to prevent the separation.

The reflectivity of the excitation light by the reflection film is 80 percent or higher and preferably 95 percent or higher, and total reflection may be made.

The dielectric multi-layered film is a film formed by alternately laminating high refraction materials and low reflection materials. The high reflection material includes $TiO_2$, $Ta_2O_5$, $ZnO$, $Si_3N_4$, and $Nb_2O_5$. Further, the low refraction material includes $SiO_2$, $MgF_2$ and $CaF_2$. The number of lamination and total thickness of the dielectric multi-layered film are appropriately selected depending on the wavelength of fluorescence to be reflected.

The material of the metal film may preferably be the following.

(1) a single layered-film such as Al, Ag or Au
(2) a multi-layered film such as Al, Ag or Au Although the thickness of the metal film is not particularly limited as far as the fluorescence can be reflected, the thickness may preferably be 0.05 µm or larger and more preferably be 0.1µ m or larger. Further, for improving the adhesion of the metal film and substrate, it may be formed through a metal film such as Ti, Cr, Ni or the like.

The method of forming the multi-layered film or metal film is not particularly limited, vapor deposition, sputtering and CVD methods are preferred. In the case of the vapor deposition method, the film-formation may be performed with ion assist.

According to a preferred embodiment, the inclination angle of the side face of the phosphor part with respect to the line normal to the incident face is 5° or larger and 30° or smaller (preferably 28° or smaller), so that it is possible to improve the output from the phosphor part.

Further, the present invention provides an illumination apparatus including a light source oscillating a laser light and the phosphor element.

As the light source, it is preferred a semiconductor laser using an GaN series material and having high reliability for excitation of a phosphor for illumination. It can be further realized a light source such as a laser array with laser elements arranged one-dimensionally. It may be used a super luminescence diode, semiconductor optical amplifier (SOA) or LED. Further, the excitation light from the light source may be made incident onto the phosphor element through an optical fiber.

Although the method of generating white light from the semiconductor laser and phosphor is not particularly limited, the following methods are considered.

Method of generating yellow fluorescence from a blue light laser and phosphor to obtain white light.

Method of generating red and green fluorescence from a blue laser and phosphor to obtain white light Further, method of generating red, blue and green fluorescence by a phosphor from a blue laser or ultraviolet laser to obtain white light Method of generating blue and yellow fluorescence by a phosphor from a blue laser or ultraviolet laser to obtain white light The present invention will be further exemplified in detail referring to the drawings.

Figure 2A:
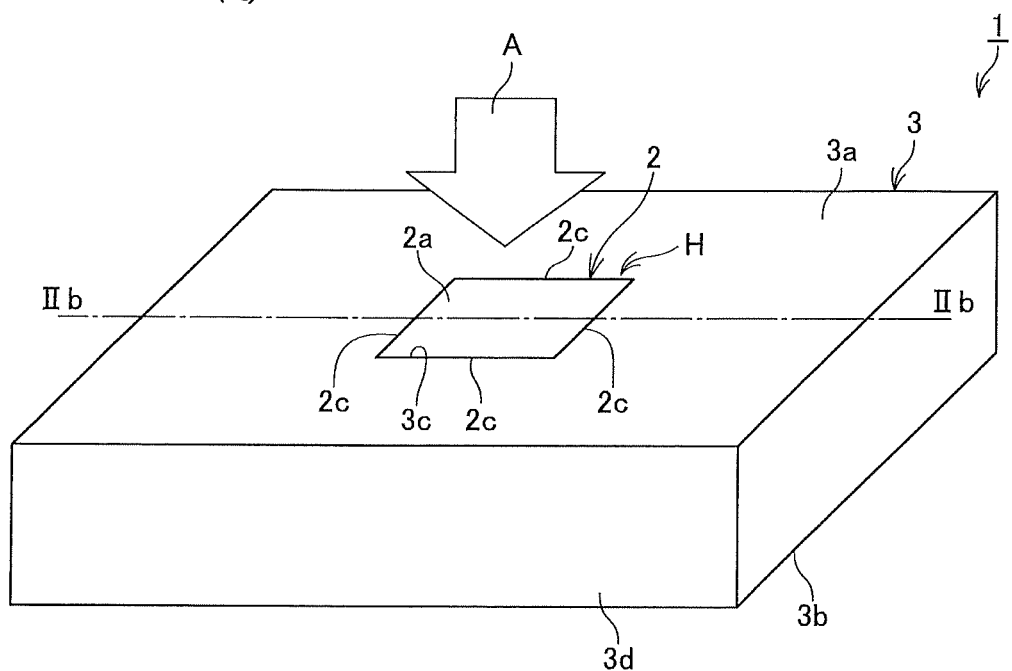
FIG. 2(a) is a perspective view showing a phosphor element 1 according to the present invention.
Figure 2B:
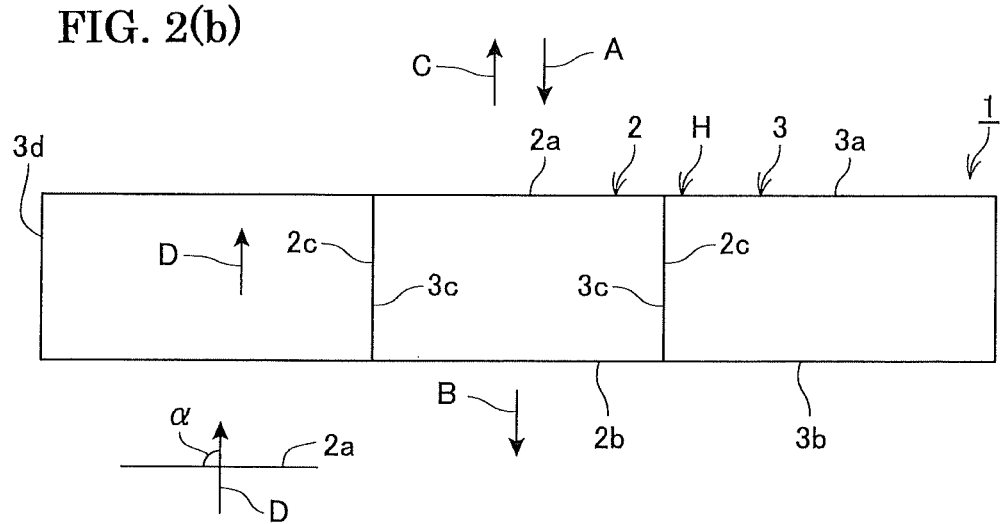
FIG. 2(b) is a cross sectional view showing the phosphor element 1.

According to a phosphor element 1 shown in FIGS. 1(a) and 2, a phosphor part 2 includes an incident face 2a, opposing face 2b and side faces 2c. According to the present example, as the phosphor part 2 has a shape of a cuboid, four flat side faces 2c are provided. However, the number and shape of the side faces are not particularly limited.

The phosphor part 2 is provided in a through hole H of a heat dissipating substrate 3 composed of a metal plating film. The heat dissipating substrate 3 includes a pair of main faces 3a and 3b, an inner wall face 3c facing the through hole and an outer peripheral face 3d. According to the present example, the side face 2c of the phosphor part 2 and the inner wall face 3c of the heat dissipating substrate directly contact each other. An excitation light is then made incident onto an incident face 2a of the phosphor part 2 as an arrow. A to convert a part of the excitation light into fluorescence. The excitation light and fluorescence are then emitted from the opposing face 2b as an arrow B. Alternatively, a reflection film is provided on the opposing face 2b to reflect the excitation light and fluorescence, which are emitted from the incident face 2a as an arrow C.

The direction of the growth of the metal plating film is the direction of an arrow D directed from the main face 3b to the main face 3a of the heat dissipating substrate 3. Alternatively, the direction of the growth of the metal plating film is the direction (direction opposite to the arrow D) directed from the main face 3a to the main face 3b of the heat dissipating substrate 3. As the plating may be also grown on the side face of the phosphor part, in this case, the plating grown from the side face is to be synthesized with the plating grown from the main face 3b or 3a and directed toward the main face 3a or 3b.

According to a preferred embodiment, the direction of the growth of the metal plating film from the main face on the side of the opposing face of the heat dissipating substrate is the direction of the arrow D. Then, an angle α of the growth direction of the arrow D of the metal plating film and of the incident face 2a may preferably be 60 to 120°. Alternatively, the growth direction of the metal plating film from the incident face-side main face of the heat dissipating substrate is opposite to the direction of the arrow D. Then, an angle α of the direction opposite to the growth direction of the arrow D of the metal plating film and of the incident face 2a may preferably be 60 to 120°.

Figure 3A:
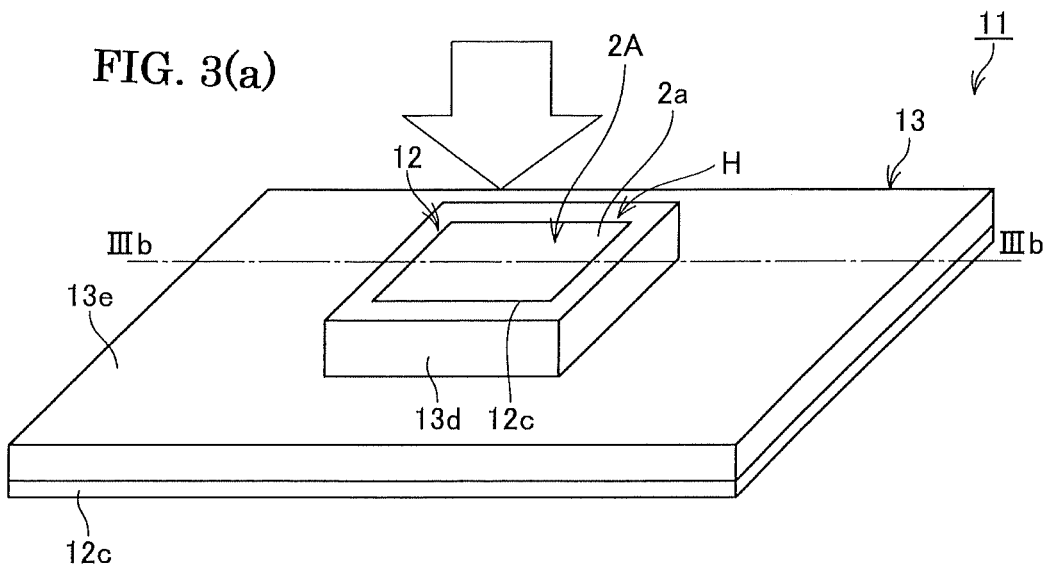
FIG. 3(a) is a perspective view showing a phosphor element 11 according to the present invention.
Figure 3B:
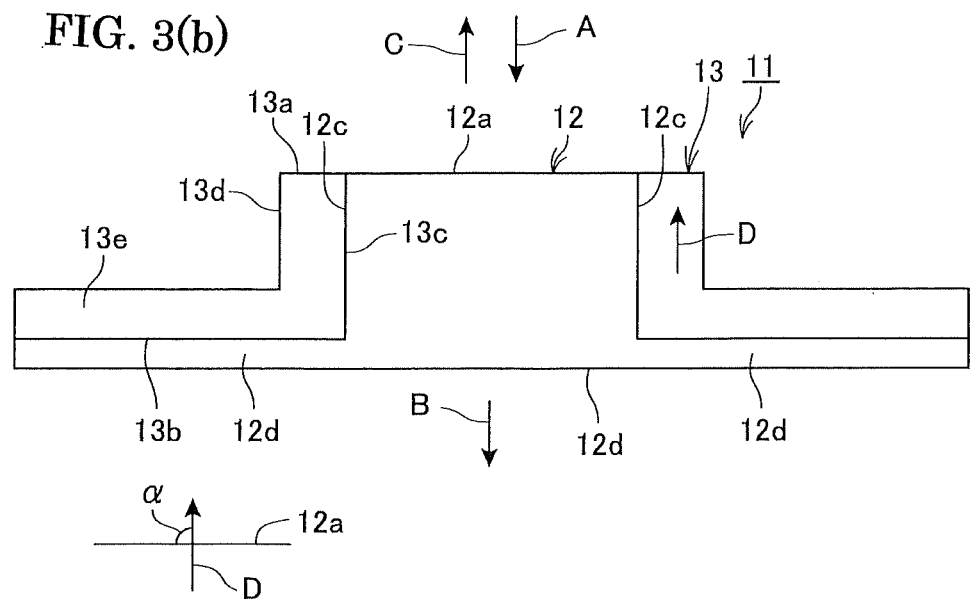
FIG. 3(b) is a cross sectional view showing the phosphor element 11.

According to a phosphor element 11 shown in FIG. 3, a phosphor part 12 includes an incident face 12a, opposing face 12b, side faces 12c and flange part 12d. Further, a heat dissipating substrate 13 includes a cylindrical part and flange part, and the cylindrical part 13a includes an inner wall face 13c facing a through hole and outer peripheral face 13d. A flange part 13e is provided on an end of the cylindrical part, and the flange part 13e and flange part 12d are laminated. The excitation light is made incident onto an incident face 12a of the phosphor part 2 as the arrow A to convert a part of the excitation light to the fluorescence. Then, the excitation light and fluorescence are emitted from the opposing face 12b as the arrow B. Alternatively, the reflection film is provided on the opposing face 12b to reflect the excitation light and fluorescence, which are emitted from the incident face 12a as the arrow C. 13b represents an end face on the opposing face-side of the heat dissipating substrate 13.

According to the present example, the flange part 13e is provided in the heat dissipating substrate and the flange part is bonded with an outer heat dissipating substrate, so that the heat dissipation can be further facilitated.

Figure 4A:
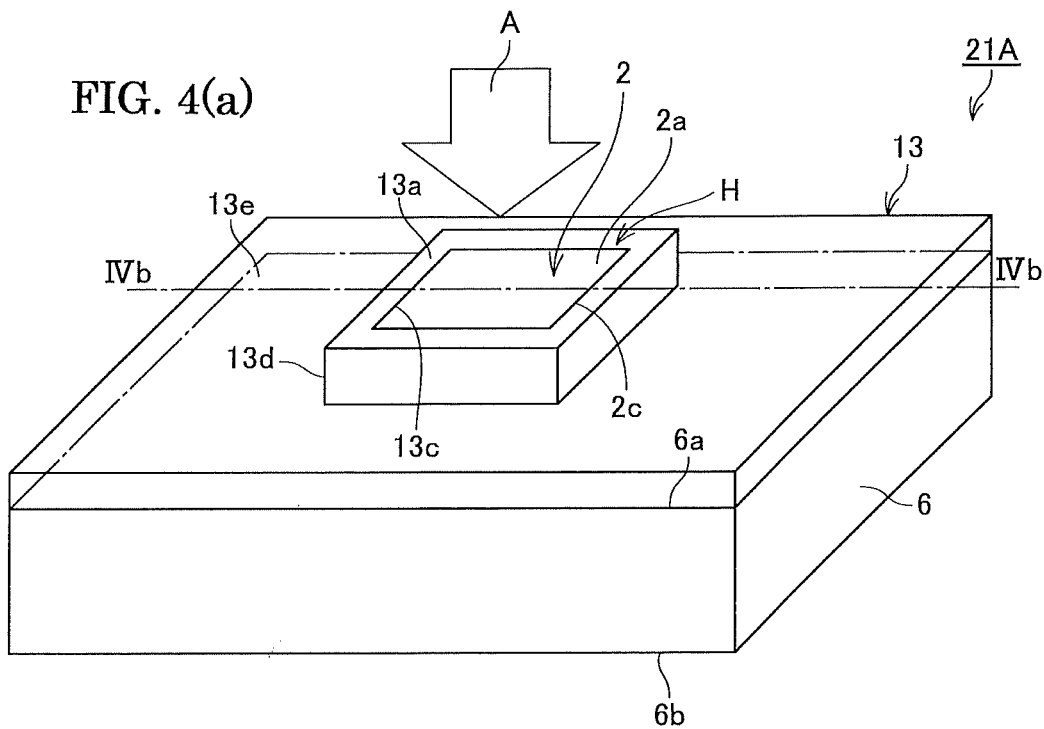
FIG. 4(a) is a perspective view showing a phosphor element 21A according to the present invention.
Figure 4B:
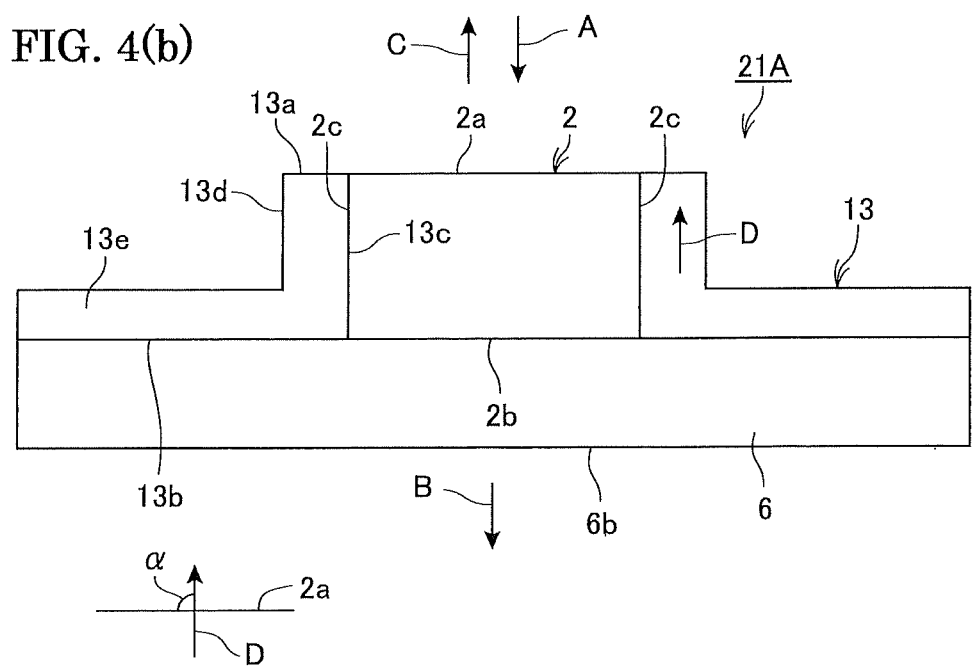
FIG. 4(b) is a cross sectional view showing the phosphor element 21A.

According to a phosphor element 21A shown in FIG. 4, the phosphor part 2 is same as the phosphor part 2 shown in FIG. 2, and the heat dissipating substrate 13 is same as the heat dissipating substrate shown in FIG. 3. However, according to the present example, an opposing face-side supporting substrate 6 is provided to cover the flange part 13e of the heat dissipating substrate 13 and opposing face 2b of the phosphor part 2. One main face 6a of the supporting substrate 6 contacts the flange part 13e and opposing face 2b, and the other main face 6b of the supporting substrate 6 faces atmosphere.

According to the present example, the flange part 13e is provided in the heat dissipating substrate 13 and the opposing face-side supporting substrate 6 is bonded with the flange part 13e, so that the heat dissipation can be further facilitated.

Figure 5A:
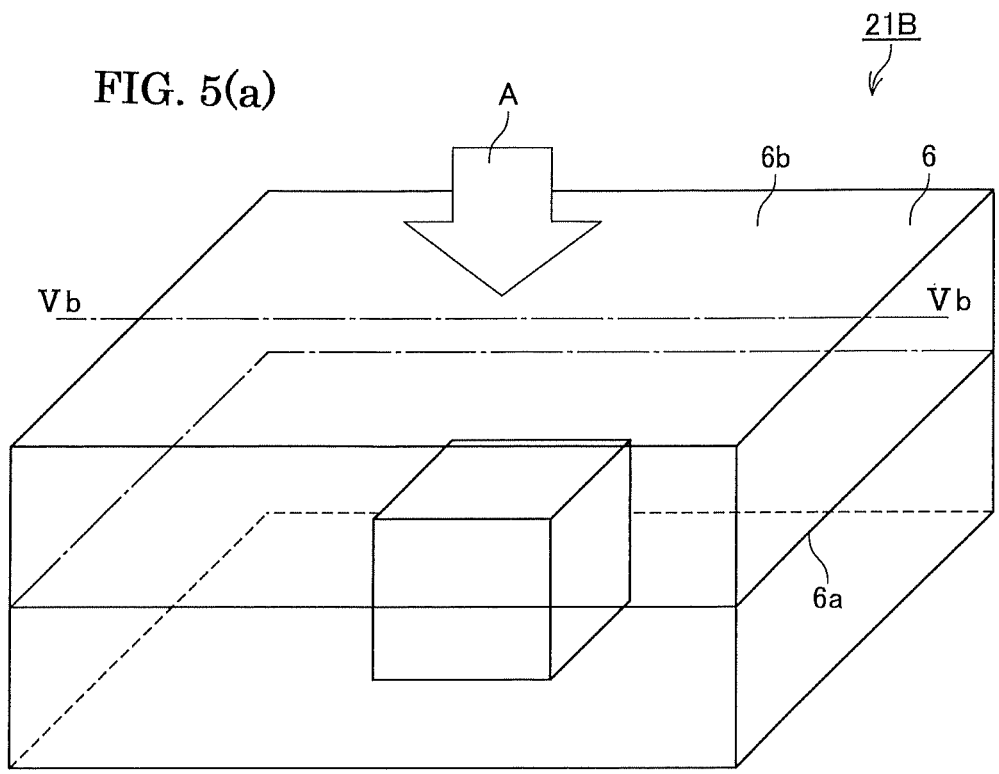
FIG. 5(a) is a perspective view showing a phosphor element 21B according to the present invention.
Figure 5B:
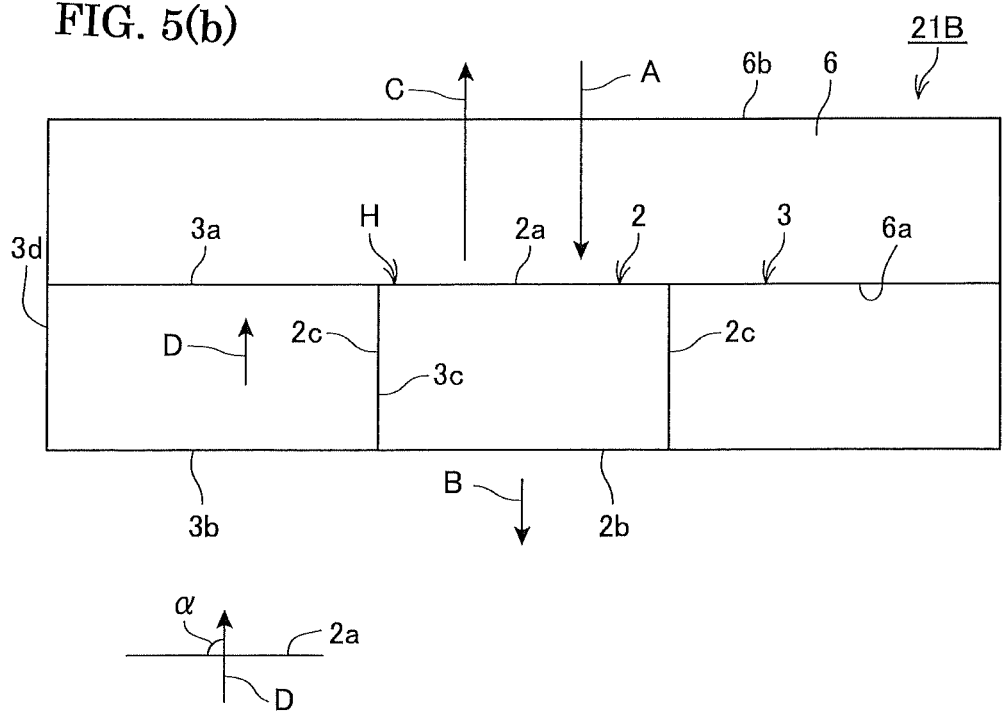
FIG. 5(b) is a cross sectional view showing the phosphor element 21B.

According a phosphor element 21B shown in FIG. 5, the phosphor part 2 is same as the phosphor part 2 shown in FIG. 2, and the heat dissipating substrate 3 is same as the heat dissipating substrate 3 shown in FIG. 2. However, according to the present example, the incident face-side supporting substrate 6 is provided to cover the incident face 2a of the phosphor part 2 and main face 3a of the heat dissipating substrate 3. One main face 6a of the supporting substrate 6 contacts the phosphor part and heat dissipating substrate 3, and the other main face 6b of the supporting substrate 6 contacts atmosphere.

According to the present example, the incident face-side supporting substrate 6 is laminated to the phosphor part and heat dissipating substrate so that the heat dissipation can be further facilitated.

Figure 6A:
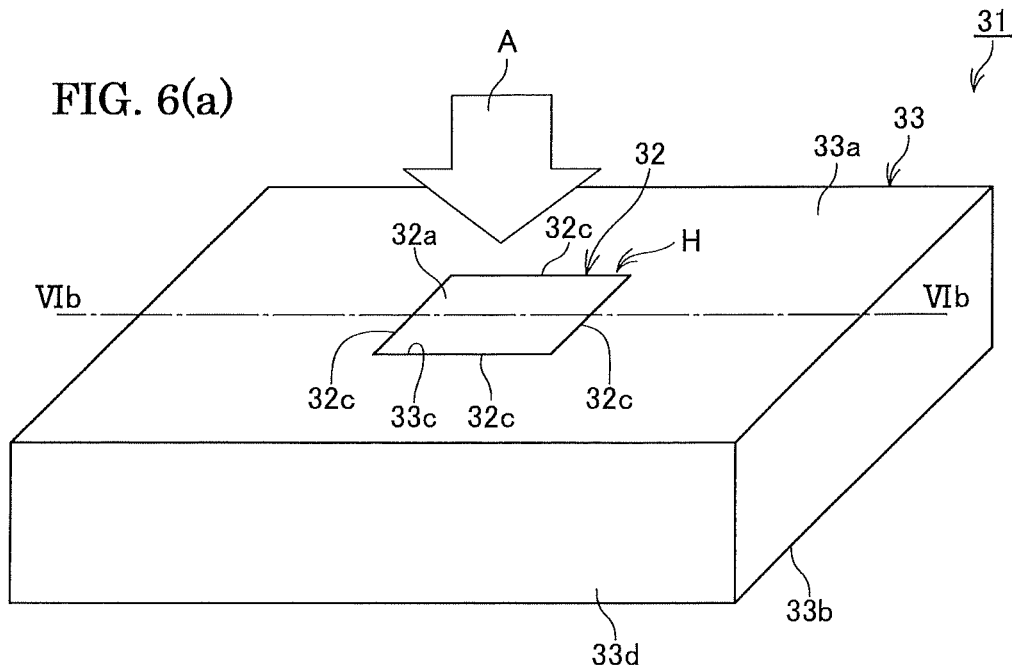
FIG. 6(a) is a perspective view showing a phosphor element 31 according to the present invention.
Figure 6B:
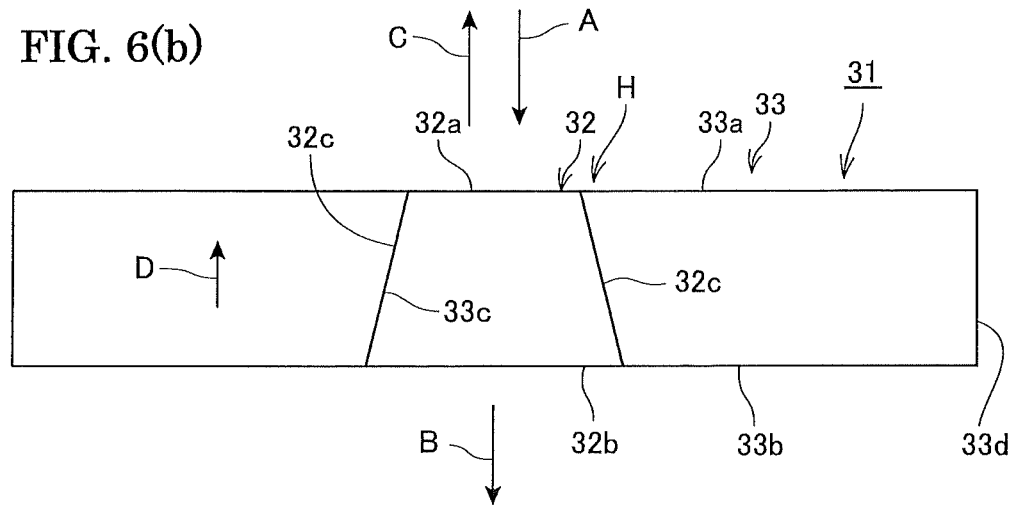
FIG. 6(b) is a cross sectional view showing the phosphor element 31.
Figure 6B:
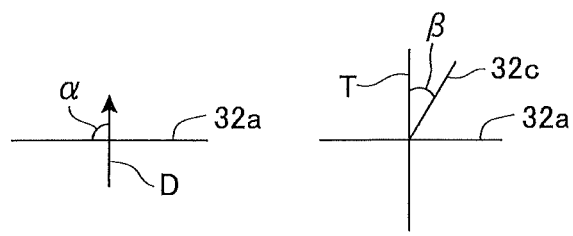

According to a phosphor element 31 shown in FIG. 6, a phosphor part 32 includes an incident face 32a, opposing face 32b and side faces 32c. However, according to the present example, for improving the efficiency of extracting the fluorescence from the emission side, an angle β of the side face 32c of the phosphor part 32 with respect to a line T normal to the incident face 32a is 5° or larger and 30° or smaller. As a result, the width of the phosphor part 32 is gradually increased from the incident face 32a to the opposing face 32b.

Further, the thickness of the phosphor part may preferably be 500 μm or larger and more preferably be 800 μm or larger, for improving the extraction efficiency of the fluorescence on the emitting side. However, the thickness may preferably be 3.0 mm or smaller, on the viewpoint of the miniaturization.

The phosphor part 32 is provided in a through hole of a heat dissipating substrate 33 composed of the metal plating film. The heat dissipating substrate 33 includes a pair of main faces 33a and 33b, an inner wall face 33c facing the through hole and an outer peripheral face 33d. According to the present example, the side face 32c of the phosphor part 32 and inner wall face 33c of the heat dissipating substrate directly contact with each other. Then, the excitation light is made incident onto the incident face 32a of the phosphor part 32 as the arrow A to convert a part of the excitation light into the fluorescence. The excitation light and fluorescence are then emitted from the opposing face 32b as the arrow B. Alternatively, the reflection film is provided on the opposing face 2b to reflect the excitation light and fluorescence, which are emitted from the incident face 32a as the arrow C.

The direction of growth of the metal plating film from the main face 3b of the heat dissipating substrate 3 is the direction of the arrow D. Alternatively, the direction of growth of the metal plating film from the main face 3a of the heat dissipating substrate 3 is the direction opposite to the arrow D. Then, the angle α of the direction of growth of the metal plating film and incident face may preferably be 60 to 120°.

Figure 7:
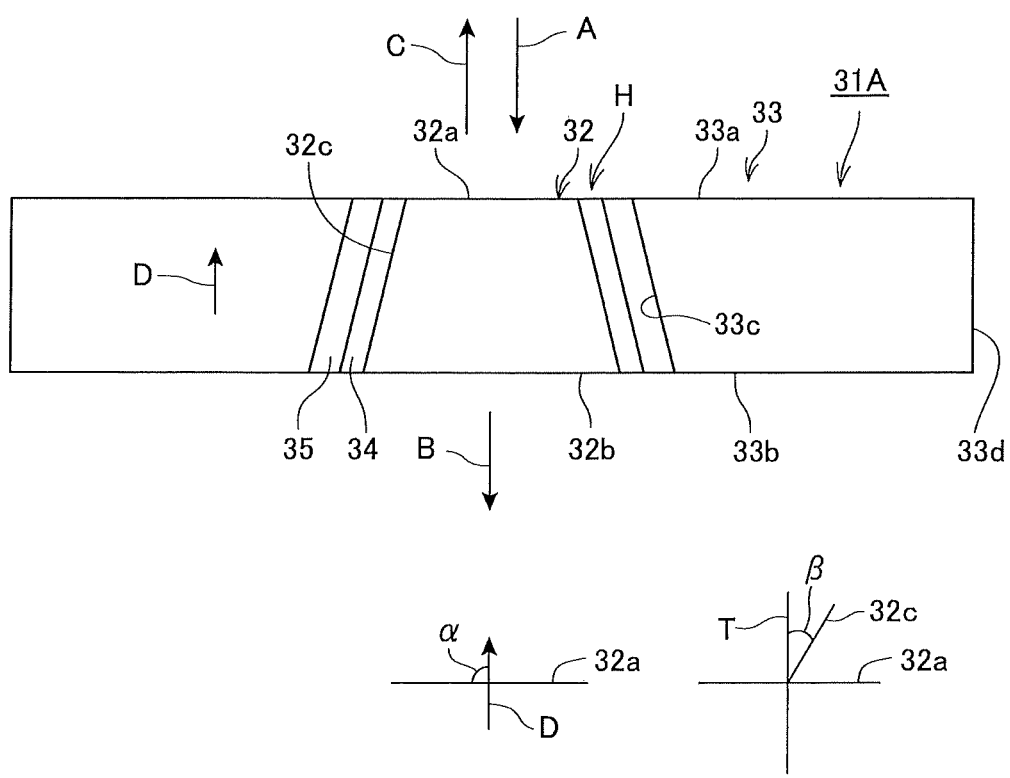
FIG. 7 is a cross sectional view of a phosphor element 31A according to an embodiment of the present invention.

According to a phosphor element 31A shown in FIG. 7, the phosphor part 32 is same as the phosphor part shown in FIG. 6, and the heat dissipating substrate 33 is same as the heat dissipating substrate shown in FIG. 6. However, a low refractive index layer 34 and reflection film 35 are formed on the side face 32c of the phosphor part 32, and the reflection film 35 contacts the heat dissipating substrate 33. An underlying layer for plating may be present between the reflection film 35 and heat dissipating substrate 33. The underlying film may be Ni, Cr, Ti or an alloy containing the metal.

Figure 8A:
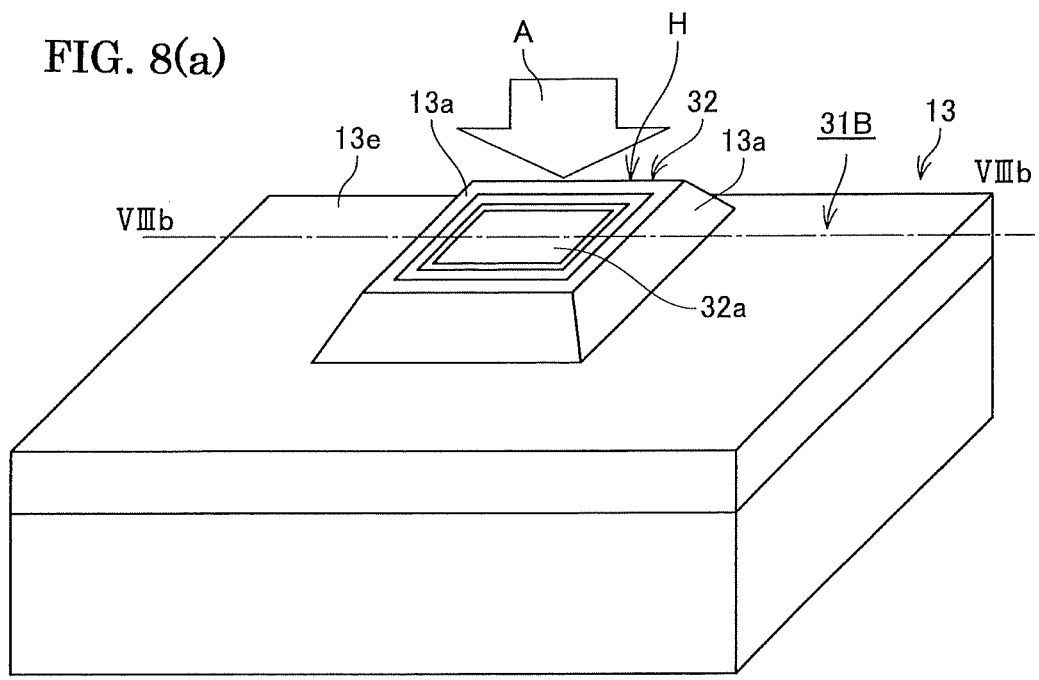
FIG. 8 (a) is a perspective view showing a phosphor element 31B according to the present invention.
FIG. 8(b) is a cross sectional view showing the phosphor element 31B.
Figure 8B:
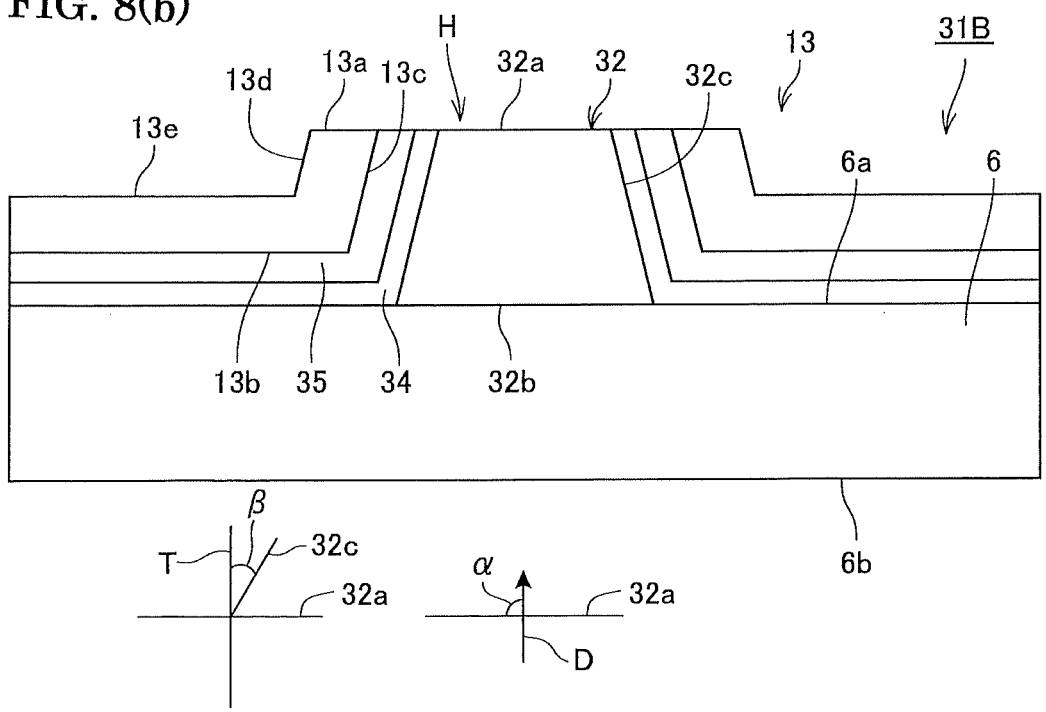

According to a phosphor element 31B shown in FIG. 8, the heat dissipating substrate 13 is same as the heat dissipating substrate 13 shown in FIG. 3, and the supporting substrate 6 is same as the supporting substrate 6 shown in FIG. 3. However, the low refractive index layer 34 and reflection film 35 are formed on the side face 32c of the phosphor part 32 and flange part 13e, and the reflection film 35 contacts the heat dissipating substrate 13. The underlying film for plating may be provided between the reflection film and heat dissipating substrate 13. The underlying film may be Ni, Cr, Ti, or an alloy containing the metal.

Figure 9A:
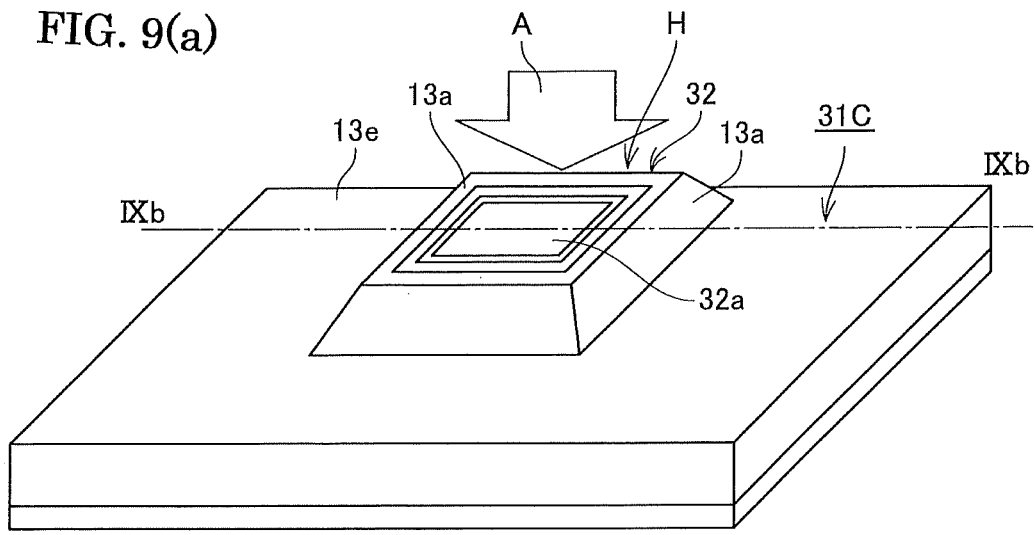
FIG. 9(a) is a perspective view showing a phosphor element 31C according to the present invention.
Figure 9B:
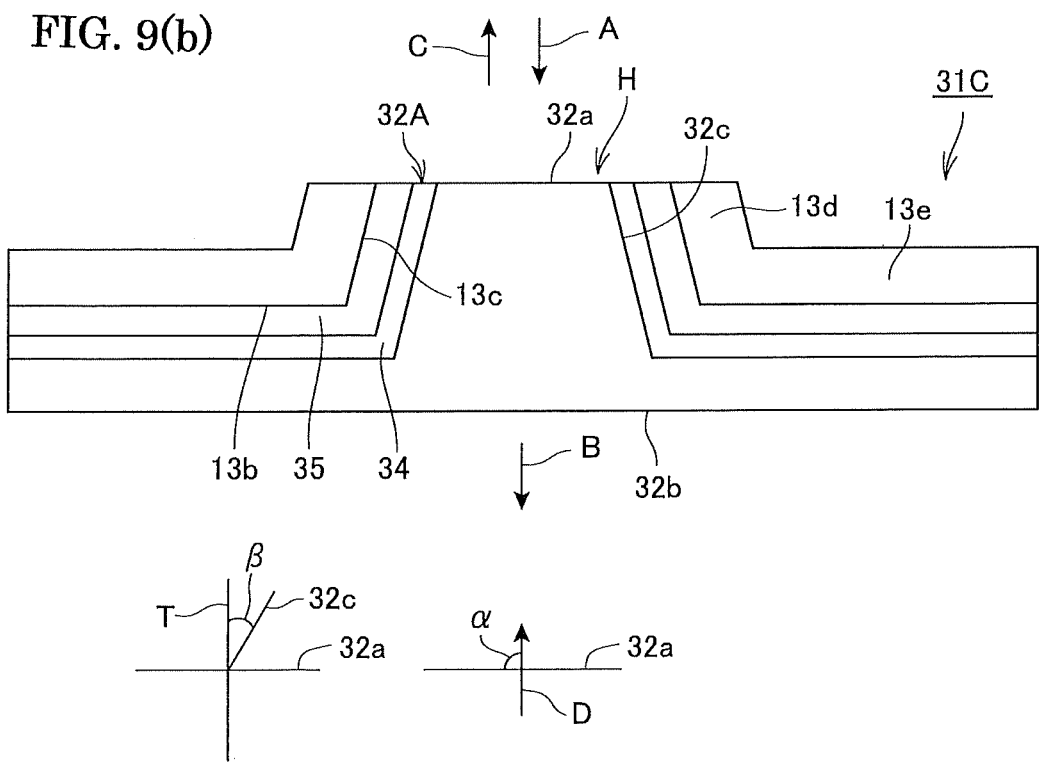
FIG. 9(b) is a cross sectional view of the phosphor element 31C.

According to a phosphor element 31C shown in FIG. 9, a phosphor part 32A includes an incident face 32a, opposing face 32b, side faces 32c and flange part 32d. Further, the heat dissipating substrate 13 includes a cylindrical part and flange part, and the cylindrical part 13a includes an inner wall face 13c facing a through hole and an outer peripheral part 13d. A flange part 13e is provided on an end of the cylindrical part, and the flange part 13e and flange part 32d are laminated. Further, according to the present example, the inclination angle β of the incident face 32c of the phosphor part 32A with respect to the line T normal to the incident face 32a is 5° or larger and 30° or smaller. As a result, the width of the phosphor part 32A is gradually increased from the incident face 32a to the opposing face 32b.

Figure 10A:
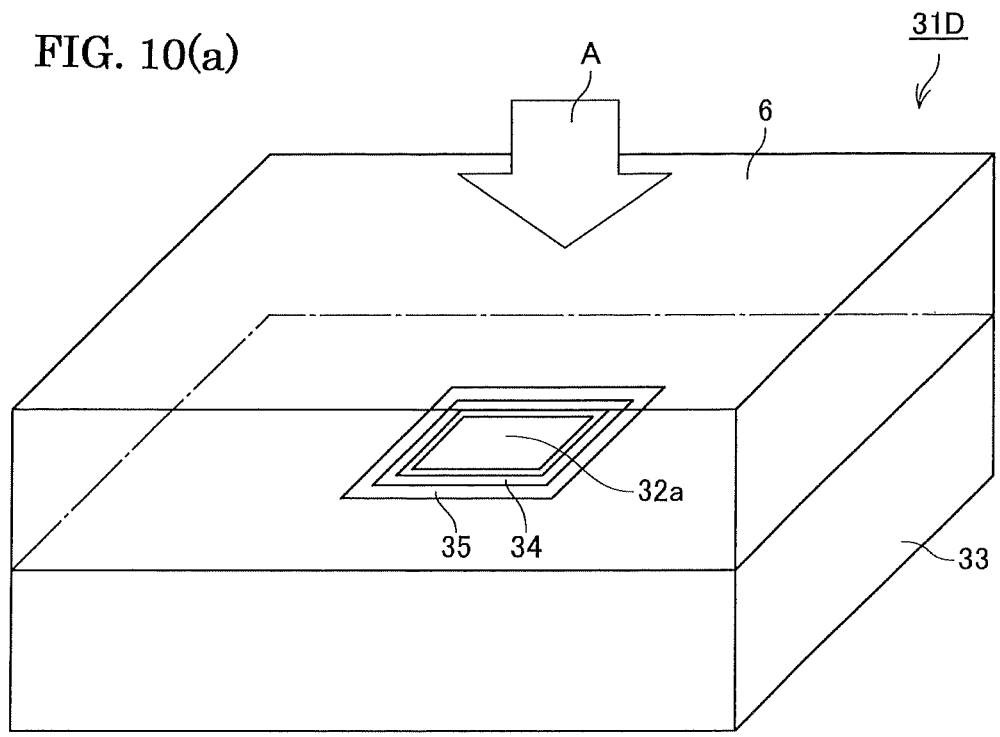
FIG. 10(a) is a perspective view of a phosphor element 31D according to the present invention.
Figure 10B:
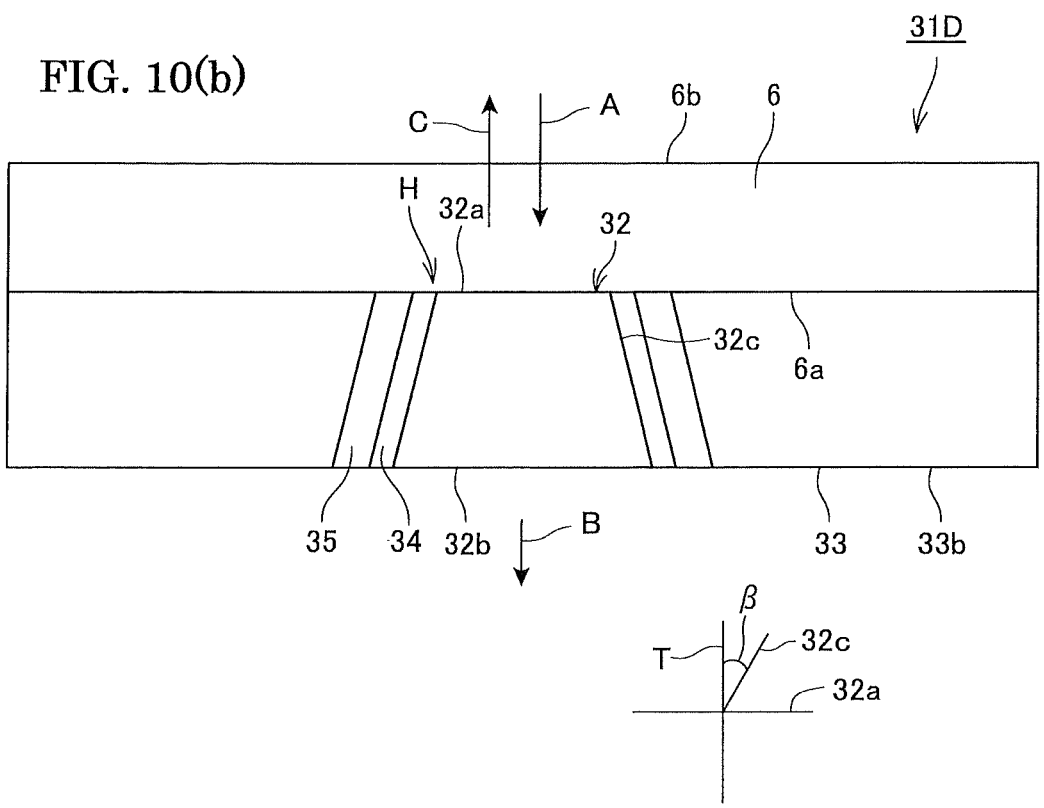
FIG. 10(b) is a cross sectional view showing the phosphor element 31D.

According to a phosphor element 31D shown in FIG. 10, the phosphor part 32 is same as the phosphor part 32 shown in FIG. 7, and the heat dissipating substrate 33 is same as the heat dissipating substrate 33 shown in FIG. 7. Further, the low refractive index layer 34 and reflection layer 35 are formed between the phosphor part 32 and heat dissipating substrate 33. Further, the supporting substrate 6 is laminated to cover the main face of the heat dissipating substrate and the incident face 32a of the phosphor part 32.

Figure 11A:
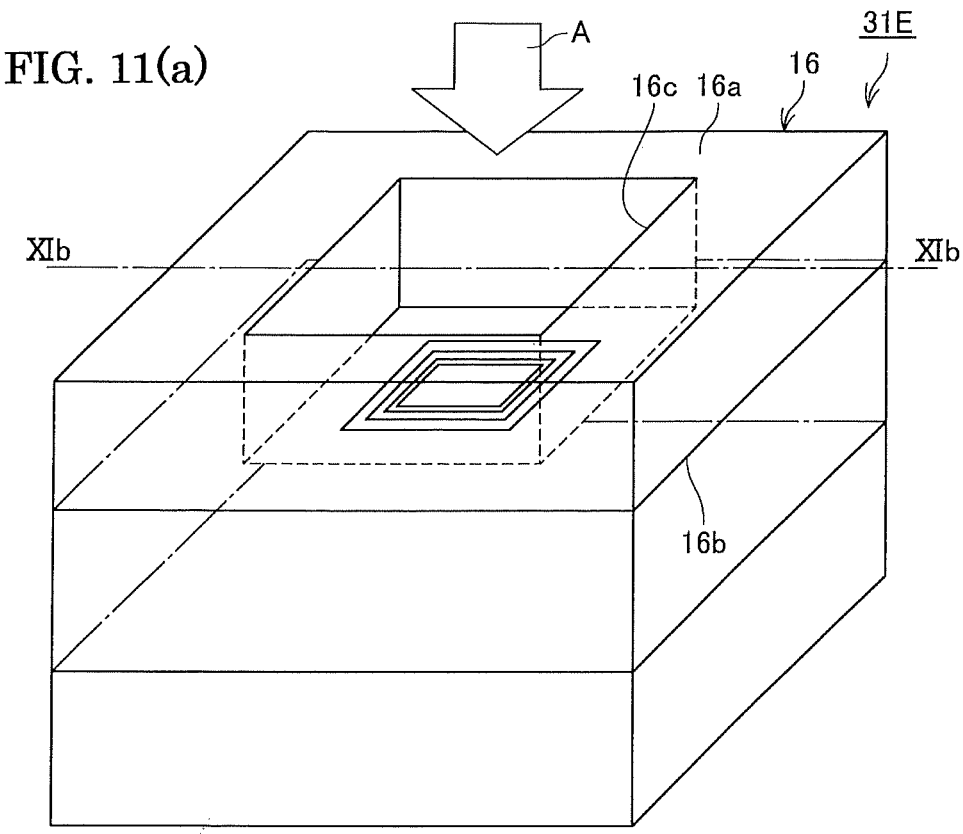
FIG. 11(a) is s perspective view showing a phosphor element 31E according to the present invention.
Figure 11B:
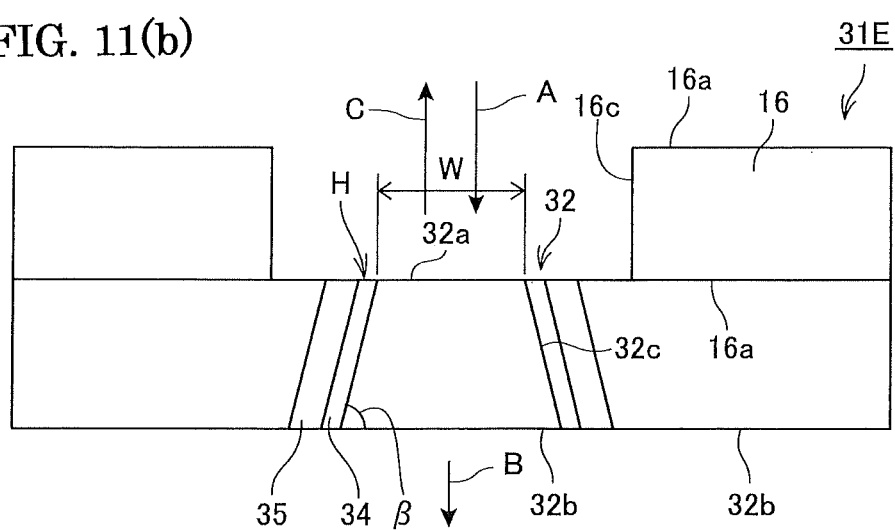
FIG. 11(b) is a cross sectional view of the phosphor element 31E.

According to a phosphor element 31E shown in FIG. 11, the phosphor part 32 is same as the phosphor part 32 shown in FIG. 7, and the heat dissipating substrate 33 is same as the heat dissipating substrate 33 shown in FIG. 7. Further, the low refractive index layer 34 and reflection film 35 are formed between the phosphor part 32 and heat dissipating substrate 33. Further, an incident face-side supporting substrate 16 is laminated on the main face of the heat dissipating substrate. An window 16c is provided between main faces 16a and 16b of the incident face-side supporting substrate 16, and the excitation light can be made incident through the window 16c as the arrow A. In the case that the window transmitting the excitation light is provided in the supporting substrate, it is not necessary that the material of the supporting substrate is a transparent or translucent material.

Figure 12A:
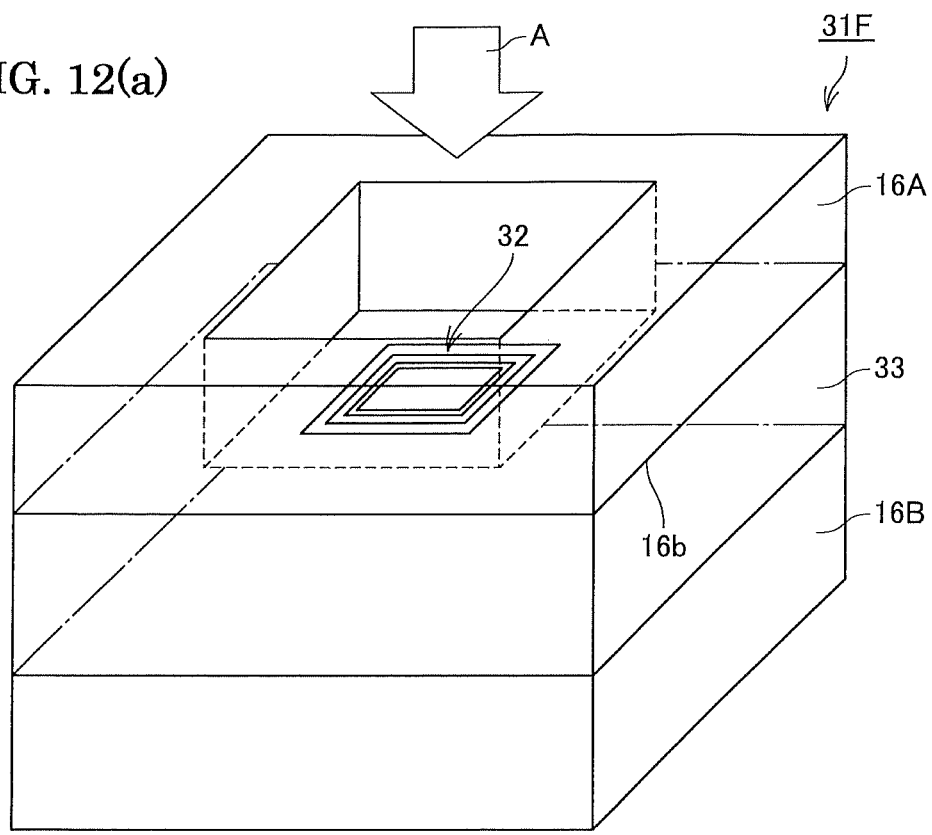
FIG. 12(a) is a perspective view of a phosphor element 31F according to the present invention.
Figure 12B:
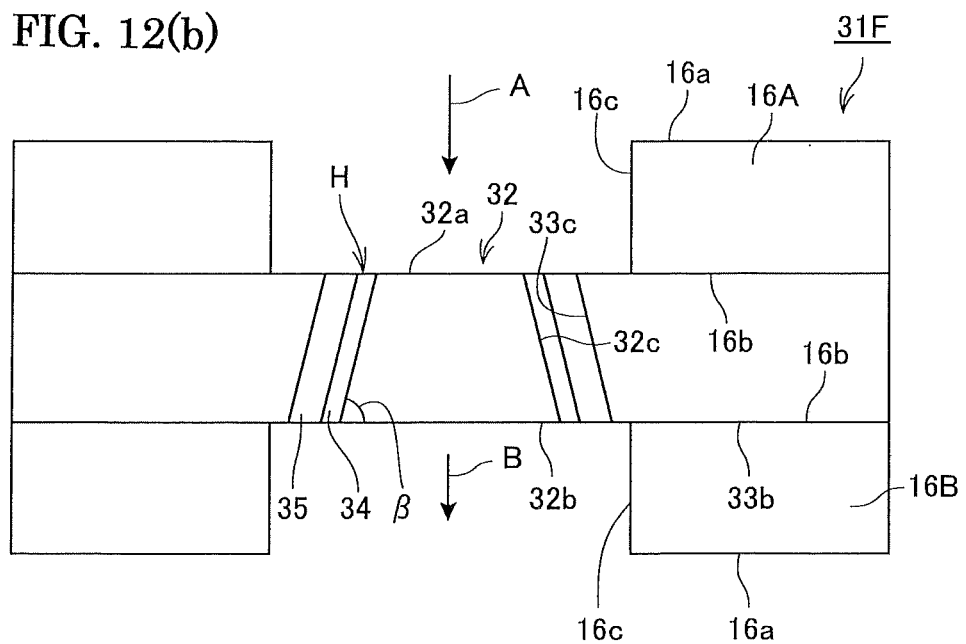
FIG. 12(b) is a cross sectional view of the phosphor element 31F.

According to a phosphor element 31F shown in FIG. 12, the phosphor part 32 is same as the phosphor part 32 shown in FIG. 7, and the heat dissipating substrate 33 is same as the heat dissipating substrate 33 shown in FIG. 7. Further, the low refractive index layer 34 and reflection film 35 are formed between the phosphor part 32 and heat dissipating substrate 33. Further, an incident face-side supporting substrate 16A is laminated on the side of the incident face of the heat dissipating substrate, and an opposing face-side supporting substrate 16B is bonded to the opposite side. A window 16c is provided between main faces 16a and 16b of each of the supporting substrates 16A and 16B, respectively, the excitation light can be made incident through the window 16c as the arrow A, or the excitation light and fluorescence can be emitted as the arrow B. In the case that such window is provided in the supporting substrate, the material of the supporting substrate is not necessarily transparent or translucent.

As many phosphor elements of the invention can be formed in a single wafer at the same time by utilizing metal plating method, it is possible to facilitate the mass production. Such production method will be exemplified below.

Figure 13A:
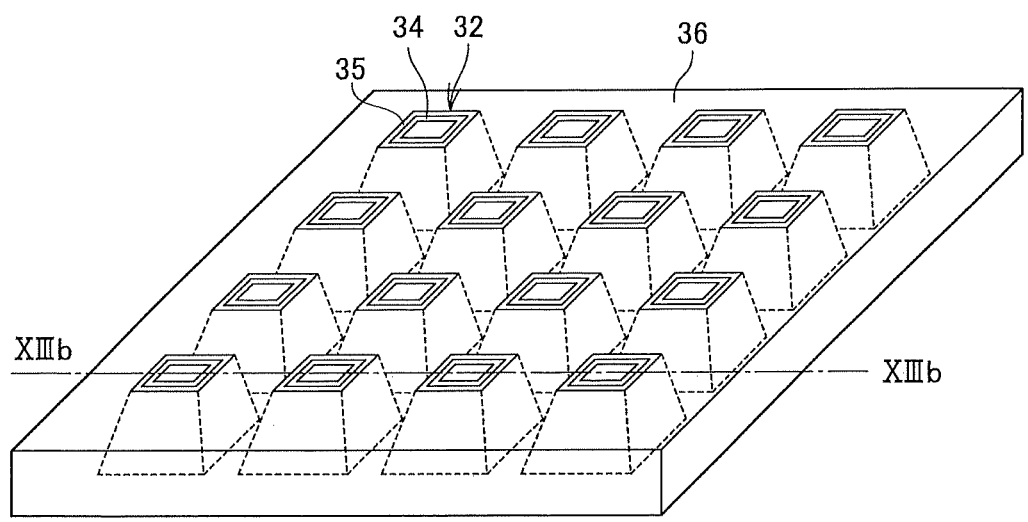
FIG. 13 (a) is a perspective view showing the state that a plurality of phosphor element parts 32 in a metal plating film 36.
FIG. 13(b) is a cross sectional view of (a).
Figure 13B:
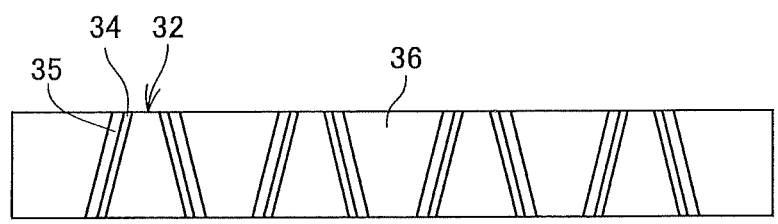

As shown in FIGS. 13(a) and 13(b), many phosphor parts 32 are formed in a metal plating film 36. According to the present example, the low refractive index layer 34 and reflection film 35 are provided between the phosphor part 32 and metal plating film 36. The respective phosphor parts 32 are then separated from the adjacent phosphor parts, respectively, to obtain phosphor elements shown in FIG. 7.

Further, it may be used as it is without separating as a device. In the case it is used as such, it may be applied for an array-type illumination apparatus.

Figure 14:
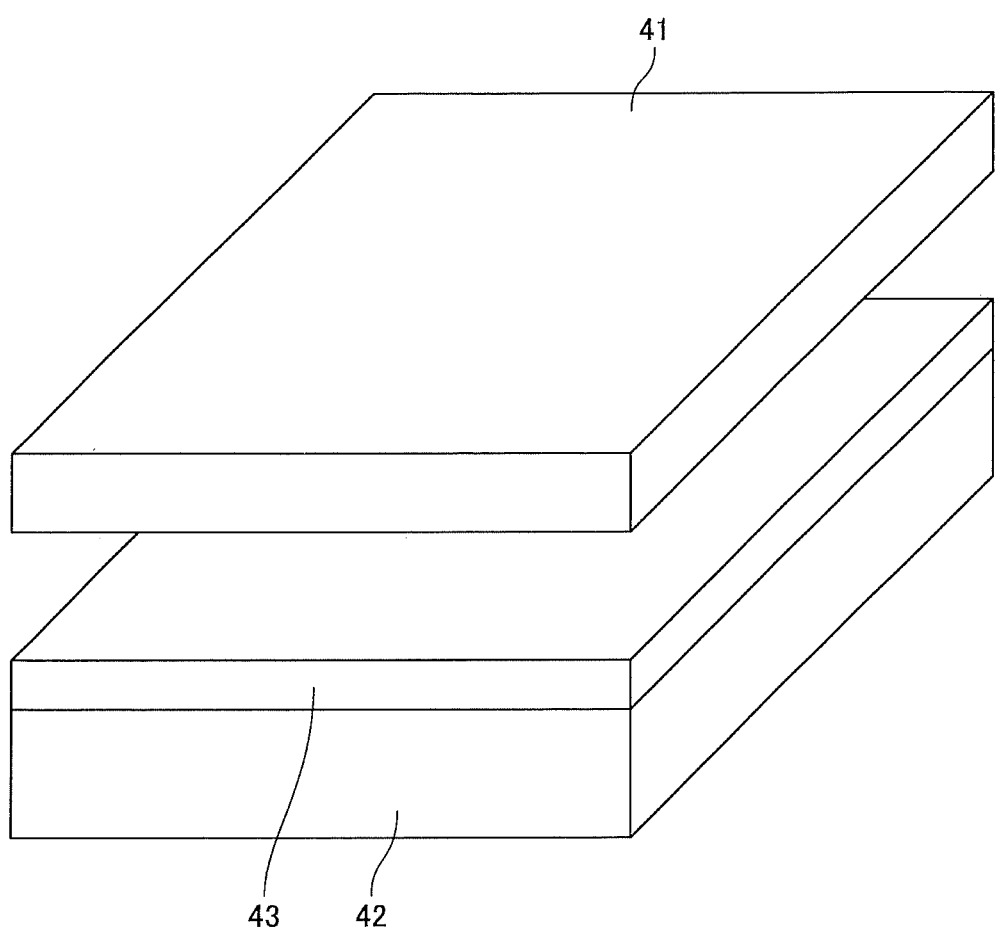
FIG. 14 is a perspective view showing the state before a phosphor plate 41 is bonded with a handle substrate 42.
Figure 15:
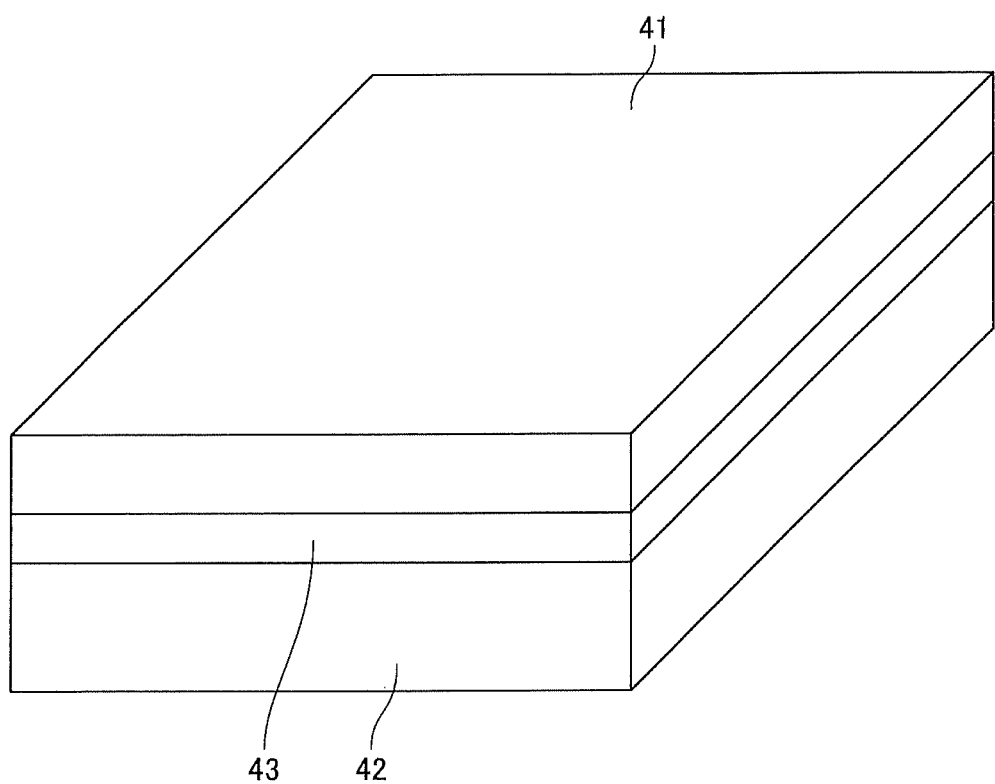
FIG. 15 is a perspective view showing a bonded body of the phosphor plate 41 and handle substrate 42.

Specific example of manufacturing process will be described below. As shown in FIG. 14, a bonding layer 43 is formed on a handle substrate 42 and opposed to a phosphor plate 41. Then, as shown in FIG. 15, the phosphor plate 41 is bonded onto the handle substrate 42.

The phosphor plate on the handle substrate is then processed to form a phosphor part having a necessary shape. For example, according to an example shown in FIG. 16, it is formed a phosphor part 32 having a desired shape on the bonding layer 43. Such processing method includes dicing, slicing, micro grinder, laser processing, water jet, and micro blasting.

Figure 17:
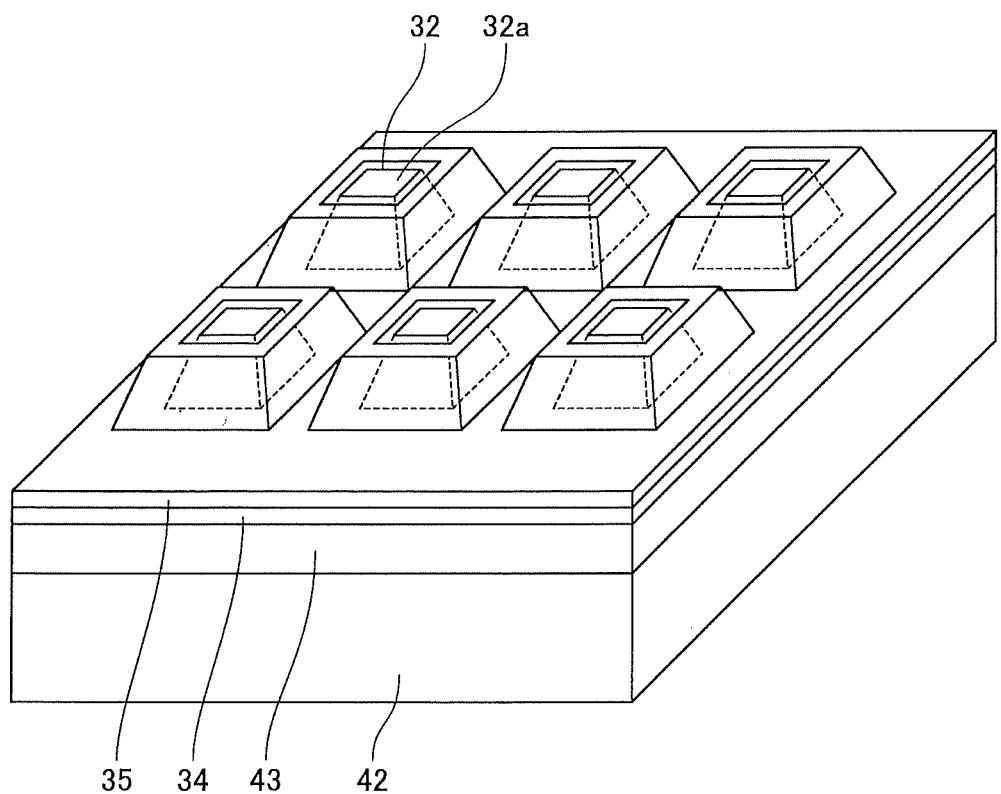
FIG. 17 is a perspective view showing the state that a low refractive index layer 34 and reflection film 35 are provided on a bonding layer 43.
Figure 18:
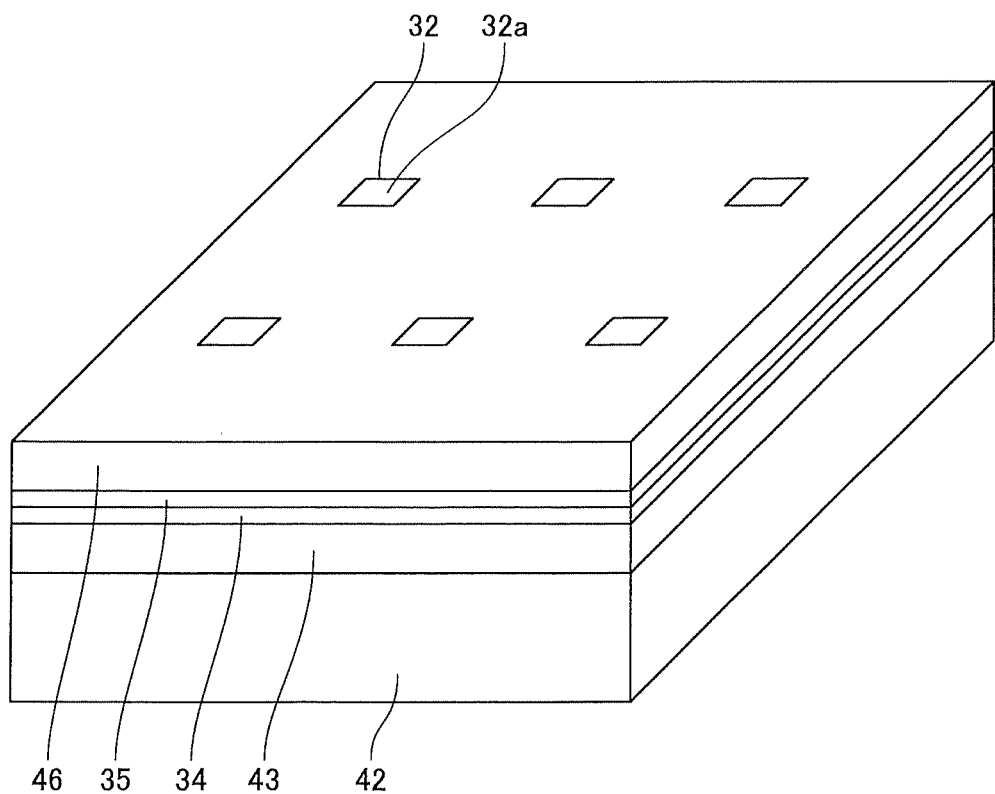
FIG. 18 is a perspective view showing the state that a metal plating film 46 is provided.

Then, according to a preferred embodiment, as shown in FIG. 17, the low refractive index layer 34 and reflection film 35 are sequentially formed on the phosphor part 32 and bonding layer 43. Then, as shown in FIG. 18, a metal plating film 46 is formed over the whole of the reflection film 35.

Figure 19:
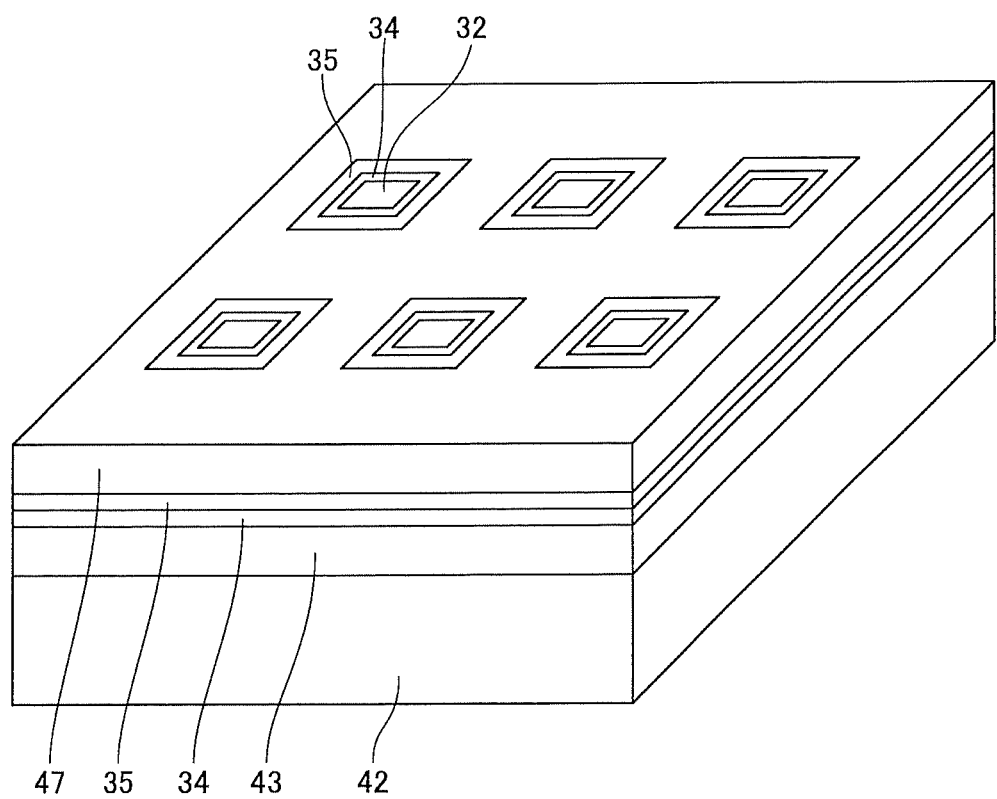
FIG. 19 is a perspective view showing the state that the metal plating film is subjected to polishing.

Then, the metal plating film 46 is subjected to polishing and thinning, so that the phosphor part 32, low refractive index layer 34 and reflection film 35 are exposed to the side of the surface of the metal plating film 47, as shown in FIG. 19.

Figure 20:
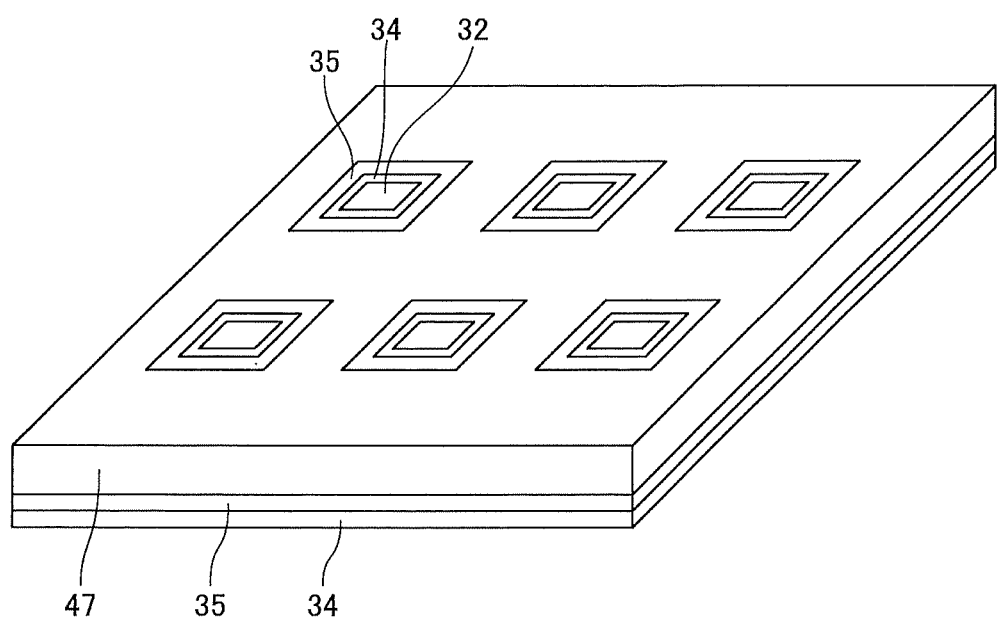
FIG. 20 is a perspective view showing the state that the handle substrate is removed.
Figure 21:
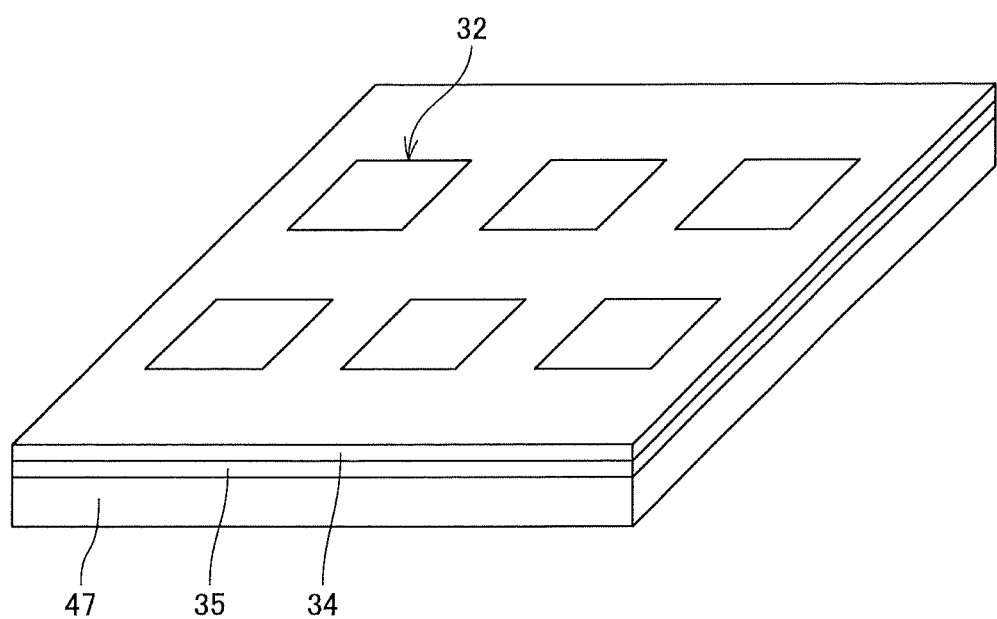
FIG. 21 is a perspective view showing the state that the handle substrate is removed, in a view from the side of an opposing face.
Figure 22:
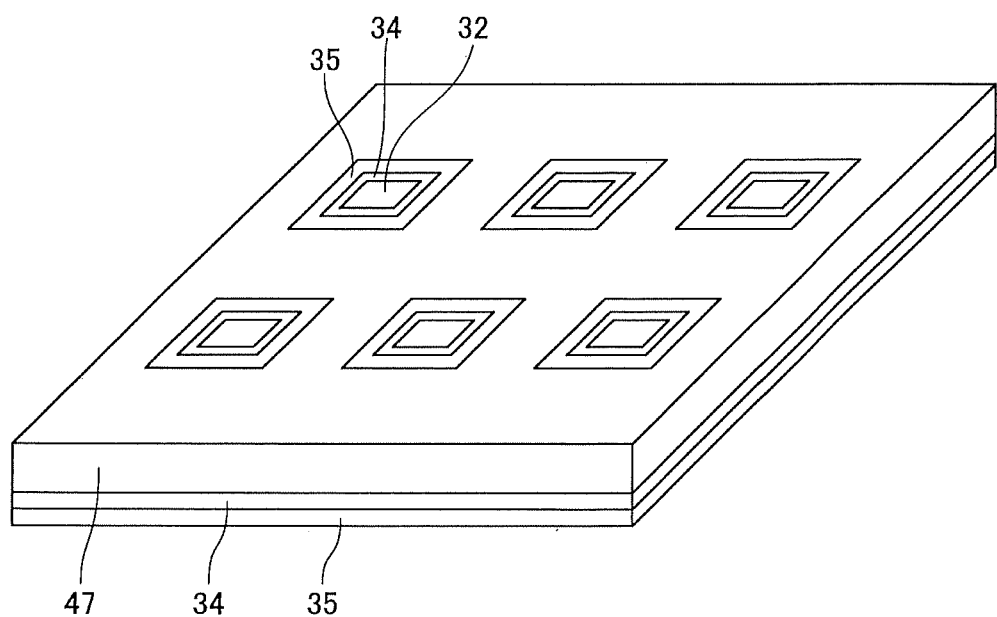
FIG. 22 is a perspective view showing the state that the opposing face side is subjected to polishing.
Figure 23:
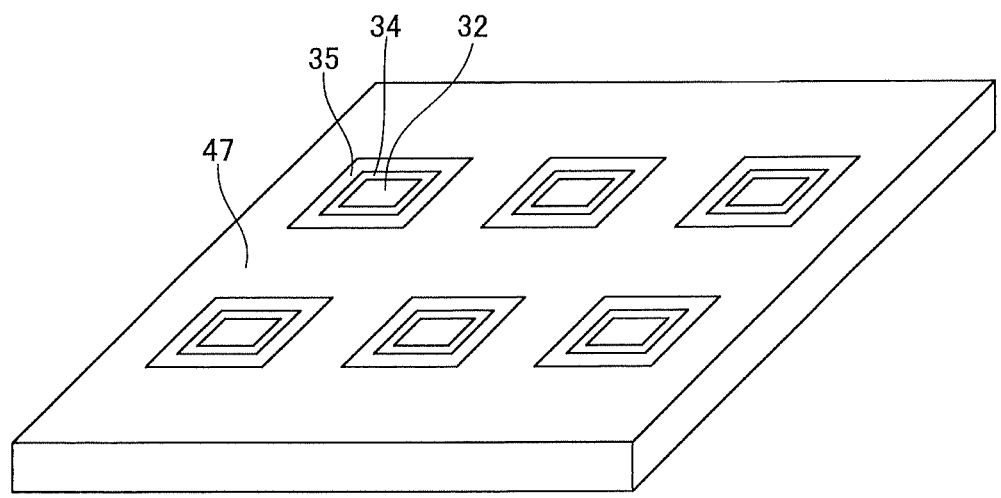
FIG. 23 is a perspective view showing the state that the incident face side is further polished.
Figure 24:
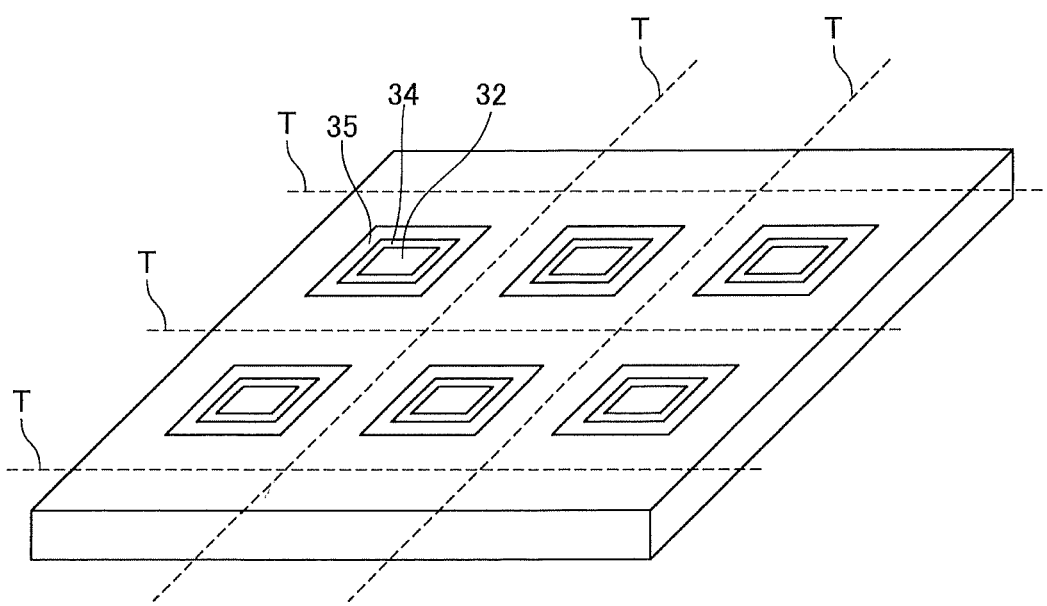
FIG. 24 is a perspective view showing steps for cutting a laminated body of FIG. 23.

Then, the handle substrate and bonding layer are removed to obtain a laminated body shown in FIG. 20. Then, the laminated body of FIG. 20 is turned over to obtain the structure that the phosphor part 32 is exposed in the low refractive index layer 34, as shown in FIG. 21. At this state, the laminated body is subjected to polishing to expose the low refractive index layer 34 and reflection film 35 on the side of the opposing face of the laminated body, as shown in FIG. 22. Then, excess metal oxide and reflection film shown in FIG. 22 are removed by processing to obtain a laminated body shown in FIG. 23. Then, as shown in FIG. 24, the laminated body is cut along the normal line T to obtain a desired phosphor element.

Figure 25:
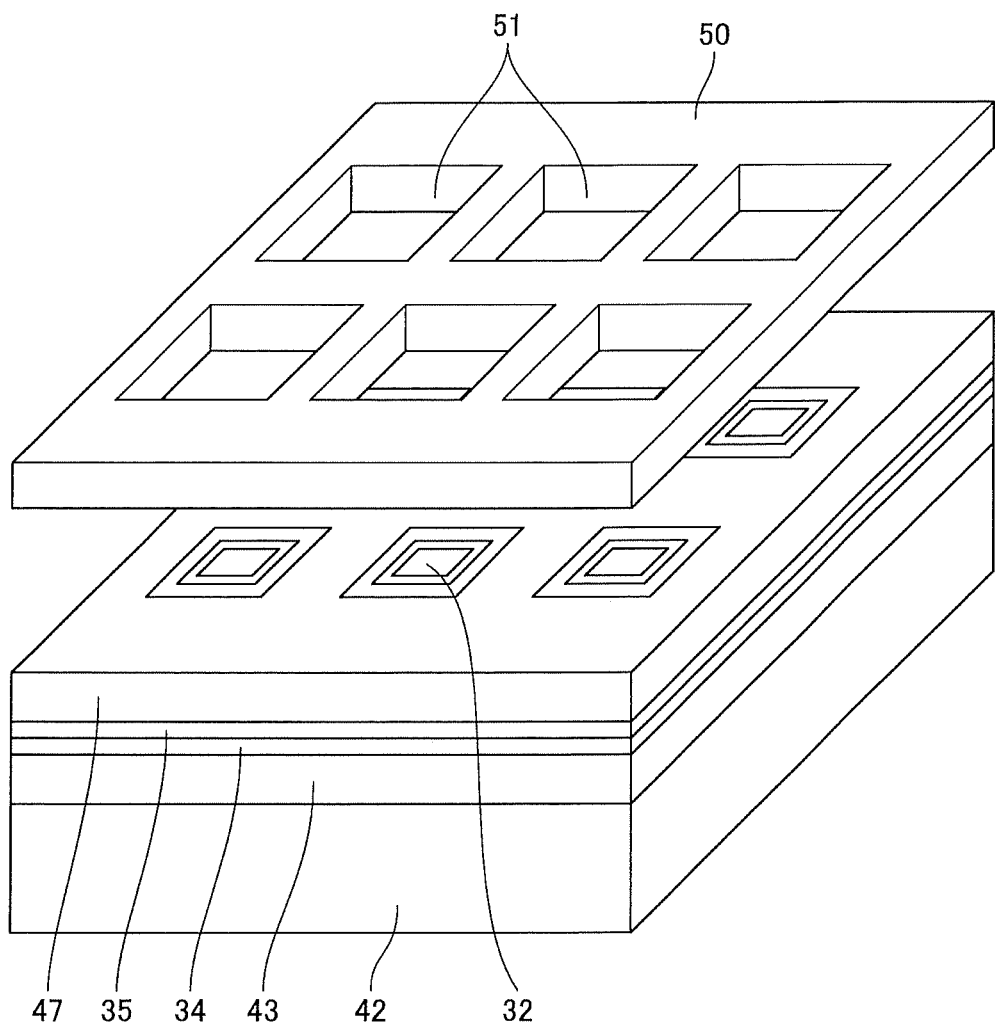
FIG. 25 shows the state before an incident face-side supporting substrate 50 is bonded onto a metal plating film 47.
Figure 26:
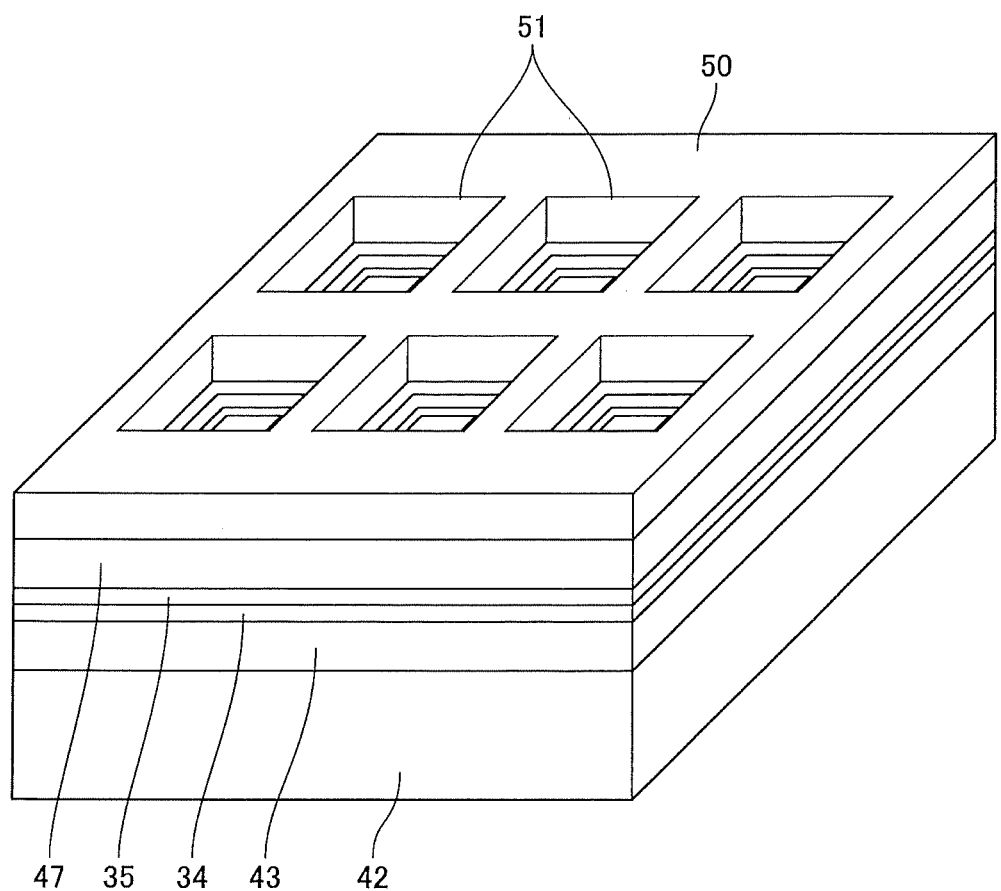
FIG. 26 shows the state that the incident face-side supporting substrate 50 is bonded with the metal plating film 47.

Further, it will be described the method of providing the incident face-side supporting substrate and opposing face-side supporting substrate on the phosphor element. For example, after the laminated body is obtained as shown in FIG. 19, the incident face-side supporting substrate 50 is opposed as shown in FIG. 25. 51 represents windows which are located at positions corresponding with the phosphor parts 32, respectively. Then, as shown in FIG. 26, the metal plating film 47 and supporting substrate are bonded with each other. Then, the handle substrate and bonding layer are removed so that a laminated body shown in FIG. 27 can be obtained.

Figure 27:
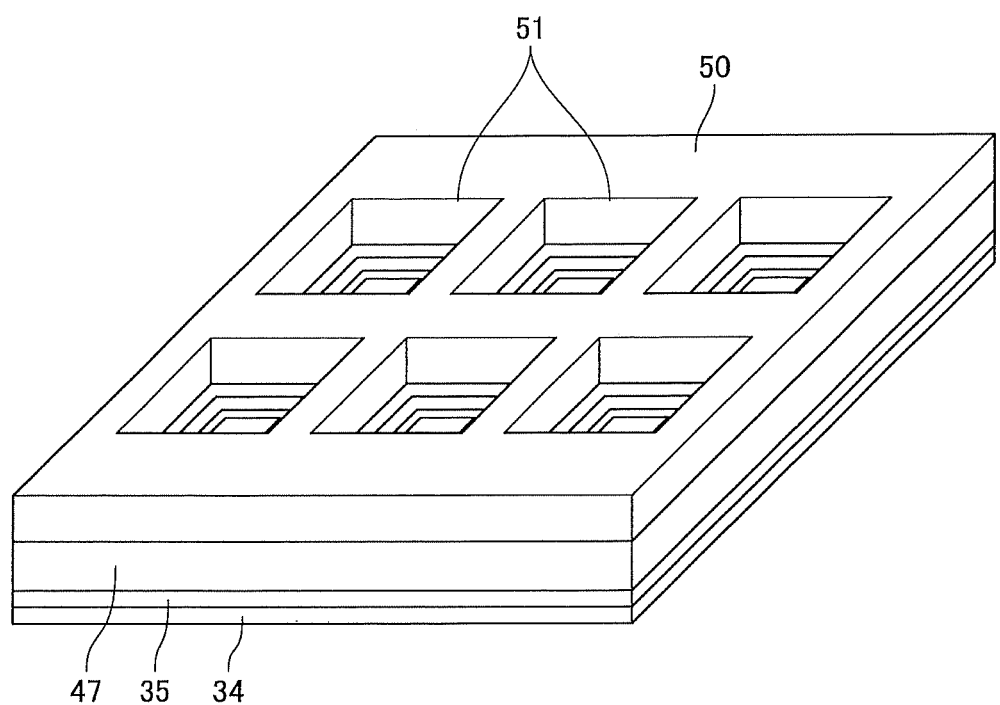
FIG. 27 shows the state that the handle substrate 42 is removed.
Figure 28:
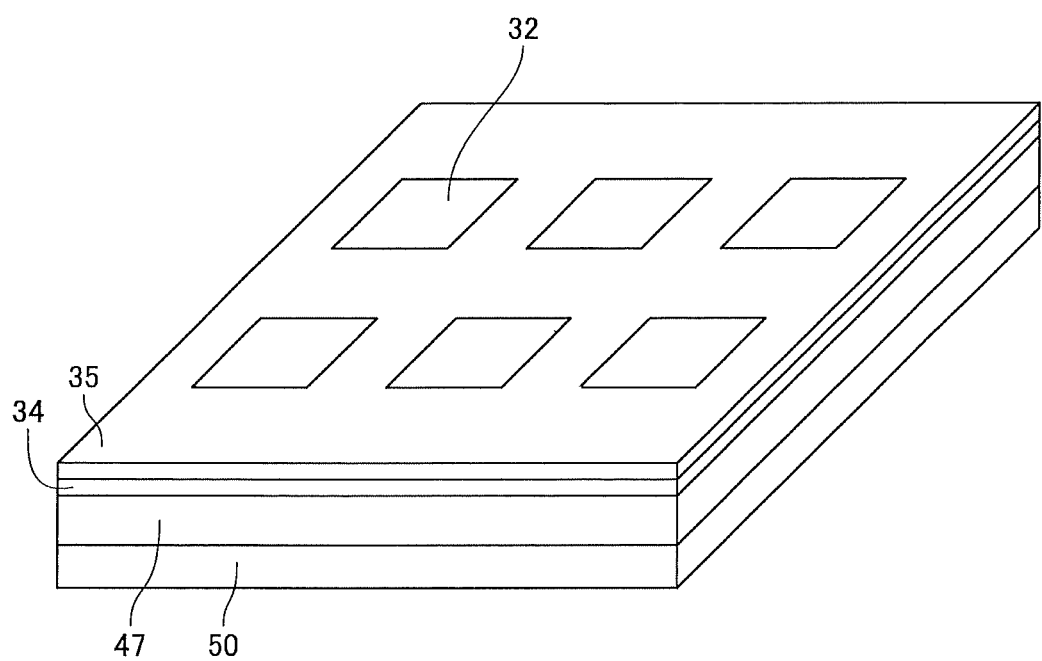
FIG. 28 shows the state that the laminated body is viewed from the side of the opposing face.
Figure 29:
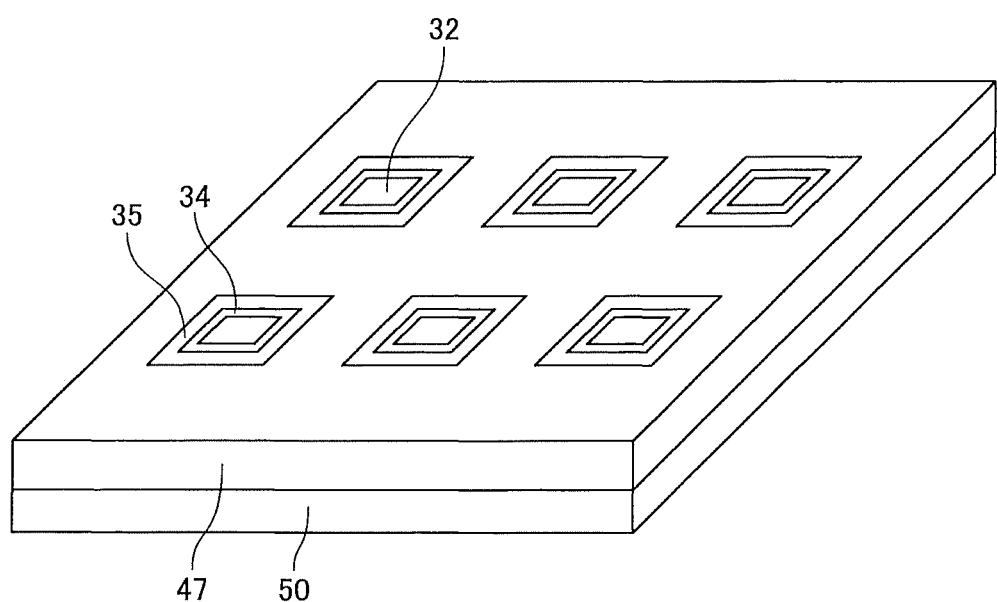
FIG. 29 shows the state that the laminated body is polished from the side of the opposing face.
Figure 30:
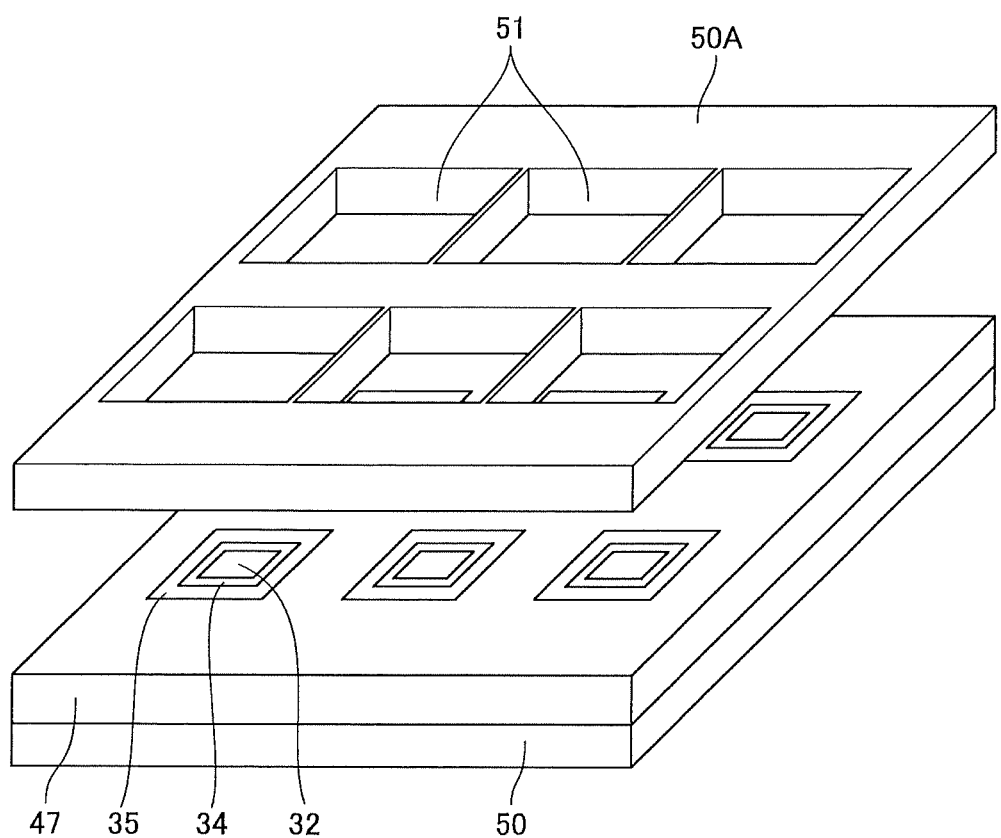
FIG. 30 shows the state before an opposing face-side supporting substrate 50A is bonded with the opposing face side of the laminated body.
Figure 31:
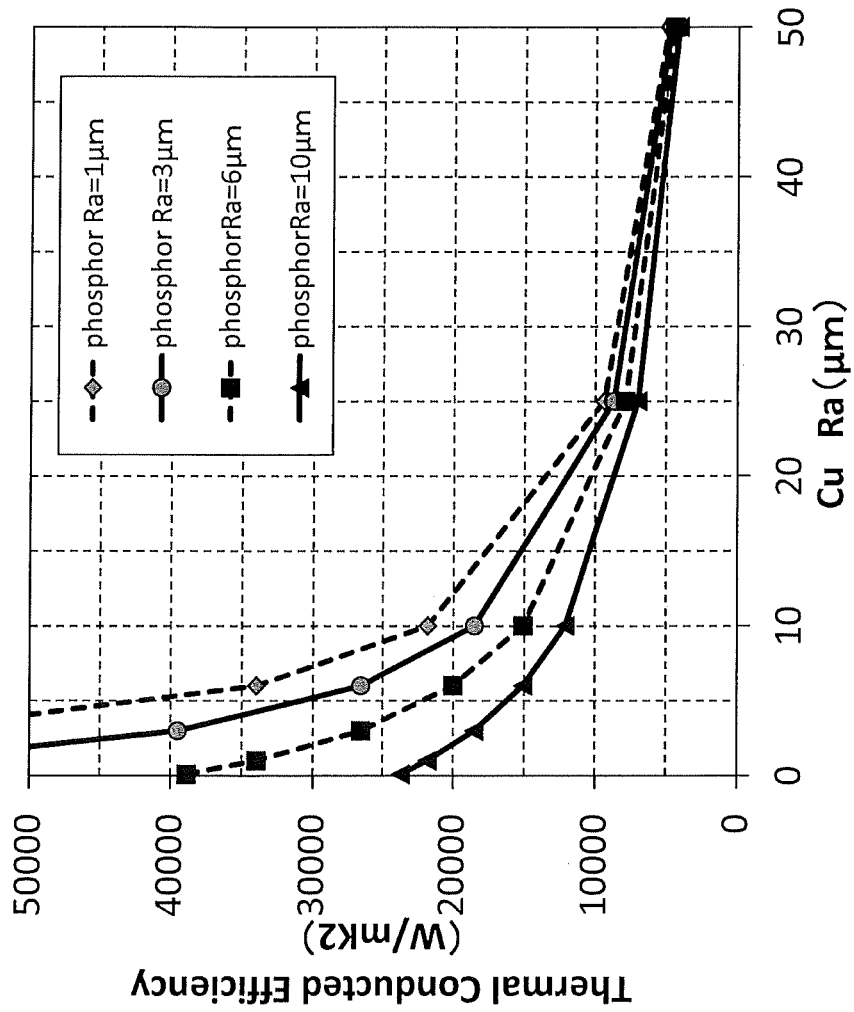
FIG. 31 shows simulation results showing the relationship between the surface roughness Ra and thermal conduction efficiency of the phosphor element.

Then, as the laminated body of FIG. 27 is turned over, it is provided the structure that the phosphor part 32 is exposed in the reflection film 35, as shown in FIG. 28. At this state, the laminated body is subjected to polishing, so that the low refractive index layer 34 and reflection film 35 are exposed on the side of the opposing face of the laminated body, as shown in FIG. 29. Then, as shown in FIG. 30, the opposing face-side supporting substrate 50A is laminated on the metal plating film 47 to obtain a laminated body. The laminated body is cut along a predetermined cutting line so that a desired phosphor element can be obtained.

Further, the thickness of the heat dissipating substrate composed of the metal plating film may preferably be 300 μm or larger and more preferably be 1.0 mm or larger, on the viewpoint of heat dissipation property. Further, the thickness may preferably be 3.0 mm or smaller on the viewpoint of miniaturization.

EXAMPLES

It was produced a phosphor element 31D shown in FIG. 10.

Specifically, as shown in FIG. 14, it was prepared a phosphor plate 41 having a thickness of 1 mm, a diameter of 4 inches and composed of YAG (yttrium·aluminum·garnet) polycrystal doped with Ce and added with ceramic dispersing material and a sapphire wafer (handling substrate) 42 having a thickness of 0.3 mm and a diameter of 4 inches. Both were bonded with each other using a thermoplastic resin at a high temperature of 100° C. and then at room temperature to obtain an integrated body (FIG. 15).

Figure 16:
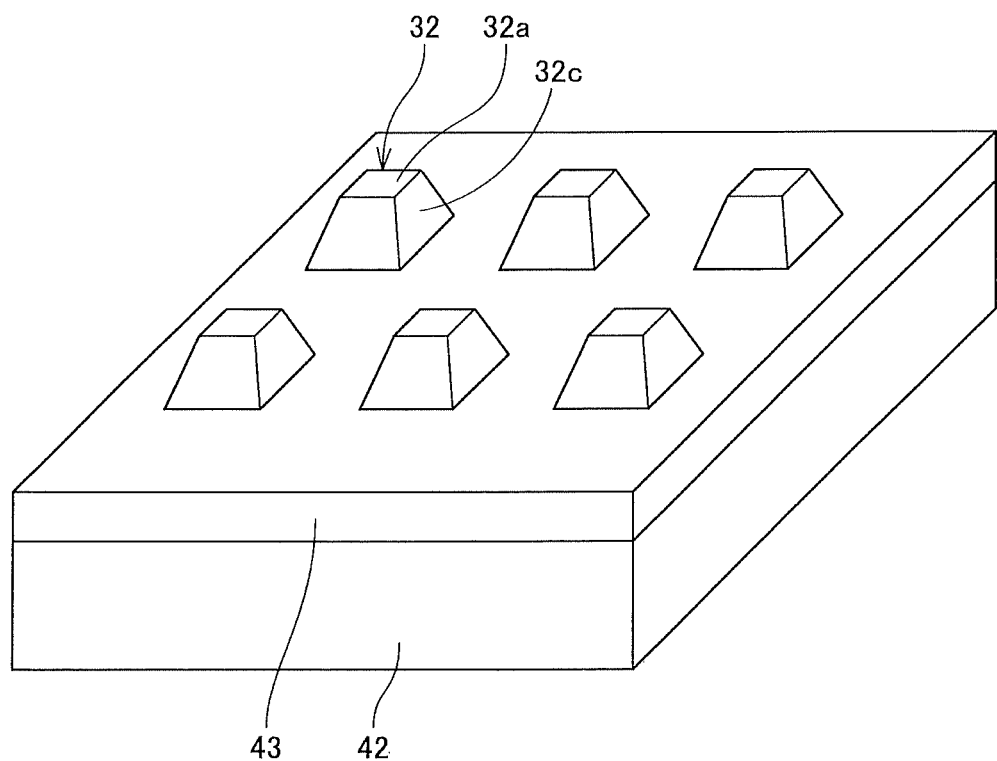
FIG. 16 is a perspective view showing the state that the phosphor plate 41 is processed to form a plurality of phosphor element parts 32.

Then, set-back processing was performed by dicing using a blade of a thickness of 100 μm and #800 to form a phosphor part whose cross sectional shape is a trapezoid having a width W at the input part was 2 mm and having an inclination angle β of 26° in the direction of thickness. Then, similarly, the laminated body was rotated by 90° in a plan view and subjected to the set-back processing by dicing again to perform the process to obtain a cross section of a trapezoid. At this time, it is estimated that the surface roughness on the processed surface for forming the trapezoid shape of the phosphor part 32 was 10 μm (FIG. 16).

Then, on the inclined surface formed by the processing for the trapezoidal shape of the phosphor part 32, the low refractive index layer 34 composed of $Al_2O_3$ was film-formed by sputtering in a thickness of 0.5 μm on the side faces. It was further formed a reflection film 35 composed of an alloy of Al on the side faces of the trapezoid in a thickness of 0.5 μm (FIG. 17).

Then, Ni film was film-formed in 0.2 μm as a base for performing copper plating to form an underlying electrode. Thereafter, based on copper damascence process, copper was plated on the side faces of the trapezoidal shape by electroplating so that a copper plating film having a thickness of 1 mm was finally formed. Thereafter, lapping and CMP polishing were performed for adjusting the phosphor on the input side and the surface of the copper plating (FIG. 19). Then, the laminated body was heated at 100° C. to soften the thermoplastic resin to remove the handle substrate 42 and bonding layer (FIG. 20). Thereafter, the surface of the phosphor on the side of the opposing face was subjected to lapping and CMP polishing to adjust the surfaces of the heat dissipating substrate and phosphor (FIGS. 21 and 22).

Then, on the incident face of the phosphor part, it was film-formed, by an IBS (Ion-beam Sputter Coater) film-forming system, a dichroic film which is not reflective with respect to the excitation light of a wavelength of 450 nm and is totally reflective with respect to the fluorescence of a wavelength of 560 nm band. The dichroic film was formed to provide the film for transmitting the excitation light and reflecting the fluorescence only. It was finally cut into chips by dicing to produce phosphor elements each of 5 mm×5 mm.

As to the chips of the phosphor elements, it was used a light source of an output of 30 W and having an array of 10. GaN series blue light lasers each having an output of 3 W to evaluate the illumination light. The results of the evaluation of the elements were shown in table 2.

Further, the angle α of the direction D of growth of the metal plating film from the main face on the opposing face side of the heat dissipating substrate and of the incident face was 90°. Further, the direction of growth of the metal plating film can be observed by using a scanning type electron microscope.

(Output Power of while Light)

The output power of white light (average output power) indicates an average per time of total luminous flux. Total luminous flux measurement was carried out by using an integrating sphere (integrating photometer), by turning on a light source to be measured and a standard light source, in which the total luminous flux was calibrated to values, at the same position, and by comparing them with each other. The measurement was carried out by using the method prescribed in JIS C7801 in detail.

(In-Plane Distribution of Color Unevenness)

Emitted light was evaluated in the chromaticity diagram by using a luminance distribution measurement device. Then, the case where the distribution is in a range of a median x: 0.3447±0.005 and y: 0.3553±0.005 is determined to be a case without the uneven color, and case where the distribution is not in this range is determined to be a case with the uneven color in the chromaticity diagram.

TABLE 2

| Input | mm | Width | 2 | |
|---|---|---|---|---|
| | mm | Thickness | 1 | |
| | ° | Inclination angle β In thickness direction | 26 | |
| Output | mm | width W | 2.98 | |
| | mm2 | Area | 8.85 | |
| Power of Excitation light | W | | 3 | 30 |
| Results of evaluation | lm | Output of white light | 800 | 2400 |
| | | Color unevenness | None | None |

Comparative Example

It was produced the phosphor element having the shape shown in FIG. 10. However, the heat dissipating substrate was not formed by metal plating film.

Specifically, the laminated body was obtained as shown in FIG. 17 according to the same procedure as the inventive example 1.

Further, a copper plate having sizes of 5 mm square and thickness of 1 mm was prepared, and it was formed a trapezoidal-shaped through hole for inserting the phosphor part by wire electric discharge machining. The electric discharge machining was performed five times so that the surface roughness of the inner wall face facing the through hole was made as small as possible. The surface roughness of the inner wall face facing the through hole was finally made 1.5 μm.

The respective phosphor parts of the thus produced laminated body were fitted together into and fixed in the respective through holes provided in the heat dissipating substrate. After the fixation, for adjusting the planes of the input-side and output-side phosphors and heat dissipating substrate, lapping and CMP polishing were performed. Thereafter, the dichroic film was formed on the input-side end face as the inventive example.

As to the chips of the phosphor elements, it was used a light source of an output of 30 W and having an array of 10. GaN series blue light lasers each having an output of 3 W to evaluate the illumination light. The results of the evaluation of the elements were shown in table 3.

Further, as the heat dissipating substrate is not composed of a metal plating film, the direction of growth could not be observed.

TABLE 3

| Input | mm | Width | 2 | |
|---|---|---|---|---|
| | mm | Thickness | 1 | |
| | ° | Inclination angle β In thickness direction | 26 | |
| output | mm | widthW | 2.98 | |
| | mm2 | area | 8.85 | |
| Power of excitation light | W | | 3 | 30 |
| Results of evaluation | lm | Output of white light | 800 | 1900 |
| | | Color unevenness | None | present |

As described above, according to the present invention, when the excitation light is made incident onto the phosphor plate to generate the fluorescence, it is possible to improve the intensity of the emitted light and to prevent color unevenness of the emitted white light during continued use.

The invention claimed is:

1. A phosphor element comprising:
a phosphor part including an incident face of an excitation light, an opposing face opposing said incident face, and a side face, said phosphor part converting at least a part of said excitation light incident onto said incident face to a fluorescence and emitting said fluorescence from said opposing face or said incident face,
a heat dissipating substrate directly or indirectly provided over said side face of said phosphor part, said heat dissipating substrate comprises a metal plating film comprising a metal having a thermal conductivity of 200 W/mK or higher,
wherein said heat dissipating substrate comprises a main face on a side of said incident face and a main face on a side of said opposing face, and
wherein an angle of said incident face and of a direction of growth of said metal plating film on a main face on said side of said opposing face or a main face on said side of said incident face of said heat dissipating substrate is 60° to 120°.

2. The phosphor element of claim 1, further comprising an incident face-side supporting substrate on a main face of said heat dissipating substrate on said side of said incident face.

3. The phosphor element of claim 1, further comprising an opposing face-side supporting substrate on the main face of said heat dissipating substrate on said side of said opposing face.

4. The phosphor element of claim 1, further comprising a low refractive index layer between said phosphor part and said metal plating filmy.

5. The phosphor element of claim 1, further comprising a reflection film between said phosphor part and said metal plating film.

6. The phosphor element of claim 1, wherein an inclination angle of said side face of said phosphor part with respect to a line normal to said incident face is 5° or larger and 30° or smaller.

7. The phosphor element of claim 1, comprising a plurality of said phosphor parts.

8. An illumination device comprising:
a light source oscillating a laser light; and
a phosphor element comprising:
a phosphor part including an incident face of an excitation light, an opposing face opposing said incident face, and a side face, said phosphor part converting at least a part of said excitation light incident onto said incident face to a fluorescence and emitting said fluorescence from said opposing face or said incident face,
a heat dissipating substrate directly or indirectly provided over said side face of said phosphor part, said heat dissipating substrate comprises a metal plating film comprising a metal having a thermal conductivity of 200 W/mK or higher,
wherein said heat dissipating substrate comprises a main face on a side of said incident face and a main face on a side of said opposing face, and
wherein an angle of said incident face and of a direction of growth of said metal plating film on a main face on said side of said opposing face or a main face on said side of said incident face of said heat dissipating substrate is 60° to 120°.

* * * * *